United States Patent [19]

Kikushima et al.

[11] Patent Number: 5,410,173
[45] Date of Patent: Apr. 25, 1995

[54] SEMICONDUCTOR INTEGRATED CIRCUIT DEVICE

[76] Inventors: Ken'ichi Kikushima, Hitachi-seiwaryo, 769, Shin-machi, Ohme-shi, Tokyo; Masaaki Yoshida, Hitachi-wakakusaryo, 657-5, Nogami, Ohme-shi, Tokyo; Shinobu Yabuki, 10-10-3-303, Kabe-machi, Ohme-shi, Tokyo, all of Japan

[21] Appl. No.: 20,793

[22] Filed: Feb. 22, 1993

Related U.S. Application Data

[63] Continuation-in-part of Ser. No. 901,775, Jun. 22, 1992, abandoned, and a continuation-in-part of Ser. No. 905,123, Jun. 24, 1992, abandoned, which is a continuation of Ser. No. 646,906, Jan. 28, 1991, abandoned.

[51] Int. Cl.6 ...................... H01L 29/78; H01L 33/00
[52] U.S. Cl. .................... 257/368; 257/396; 257/385
[58] Field of Search ................ 257/368, 296, 385

[56] References Cited

U.S. PATENT DOCUMENTS

| | | | |
|---|---|---|---|
| 4,716,450 | 12/1987 | Hashishita | 257/211 |
| 4,797,717 | 1/1989 | Ishibashi et al. | 257/382 |
| 4,920,403 | 4/1990 | Chow et al. | 357/71 |
| 4,928,160 | 5/1990 | Crafts | 357/54 |
| 4,992,845 | 2/1991 | Arakawa | 357/42 |
| 5,001,487 | 3/1991 | Suzuki et al. | 357/43 |
| 5,047,825 | 9/1991 | Yasaka et al. | 357/42 |
| 5,107,321 | 4/1992 | Ildorem et al. | 357/43 |
| 5,223,733 | 6/1993 | Doi et al. | 257/386 |

FOREIGN PATENT DOCUMENTS 421168  4/1991  European Pat. Off. ............ 257/368

Primary Examiner—Andrew J. James
Assistant Examiner—Stephen D. Meier
Attorney, Agent, or Firm—Antonelli, Terry, Stout & Kraus

[57] ABSTRACT

In a semiconductor integrated circuit device having cells comprising circuit elements including MISFETs, and a multi-layer wiring structure, wirings of a first layer connected to semiconductor regions of the MISFETs (source and drain regions) are formed almost in the entire area over the regions to shunt the regions. Power supply wiring are formed of second layer wirings. First layer wirings and the semiconductor regions are connected through a plurality of contact holes. The power supply wirings are formed to cover at least part of the semiconductor regions. In accordance with another aspect, macro-cells are formed by basic cells, including a plurality of MISFETs with the direction of gate length aligned in a first direction, regularly arranged in the first direction and in a second intersecting direction. The MISFETs in each basic cell are interconnected by a first-layer signal wiring, basic cells adjacently arranged in the second direction are interconnected by a first-layer signal wiring extending in the second direction, and basic cells adjacently arranged in the first direction are interconnected by a second-layer signal wiring extending in the first direction. The MISFETs in basic cells adjacently arranged in the first direction receive power from a second-layer power wiring located in the same layer of the second-layer signal wiring and extended in the same first direction. A fourth-layer power supply wiring and a fourth-layer signal wiring, both extending in the first direction, are also provided.

13 Claims, 29 Drawing Sheets

SEMICONDUCTOR INTEGRATED CIRCUIT DEVICE

This application is a continuation-in-part application of Ser. No. 07/901,775 filed on Jun. 22, 1992, now abandoned, by Shinobu YABUKI and Ser. No. 07/905,123 filed on Jun. 24, 1992, now abandoned, by Ken'ichi KIKUSHIMA and Masaaki YOSHIDA, which is a continuation of application Ser. No. 07/646,906 filed on Jan. 28, 1991, now abandoned.

BACKGROUND OF THE INVENTION

The present invention relates to a semiconductor integrated circuit device and, more particularly, to a technique effectively applicable to a logic LSI comprising circuit elements including MISFETs (Metal-Insulator-Semiconductor Field Effect Transistor) and multi-layer wiring structure.

For an ASIC (Application Specific Integrated Circuit or Application Specific Standard Product), there are, for example, gate arrays and standard cell LSIs (called also a cell based IC). The gate array is a typical example of the semiconductor integrated circuit device fabricated by the master slice system. This gate array is prepared by arranging many basic cells uniformly on a semiconductor substrate in advance, and is used to fabricate an LSI with desired logic circuits by connecting the basic cells with signal wirings in accordance with the user's requirements.

The basic cell comprises CMOS (Complementary MOS) or BI-CMOS (Bipolar CMOS) elements, for example.

The feature of the semiconductor integrated circuit device, for which a master slice system of this kind is adopted, is that various logic circuits can be formed simply by varying its wiring patterns, thereby developing many varieties in a short period of time.

In a semiconductor integrated circuit device having a multi-layer wiring structure such as the gate array mentioned above, the power supplied from the outside is transmitted to the inside of the semiconductor integrated circuit device through a pair of supply wirings. One of the pair of supply wirings is connected to an external power source terminal to which a higher level voltage (hereinafter referred to simply as a source voltage $V_{DD}$) is supplied while the other is connected to another external power scarce terminal to which a lower level voltage (hereinafter referred to simply as an ground voltage $V_{ss}$) is supplied.

On the circumferential part of a semiconductor chip having the above semiconductor integrated circuit device formed thereon, there are arranged in succession bonding pads which provide electrical connections with the outside, and I/O cells which selectively function as an input/output buffer circuit, an output buffer circuit, or an input buffer circuit. In an inner area encircled by the I/O cells on its circumference (cell region), a plurality of basic cells are arranged regularly. On the plural wiring layers on the I/O cells and the cell region, the signal wirings and supply wirings are arranged by an automatic arrangement and wiring system. On the wiring layer of a first layer in the cell region, the supply wirings (supply wirings for cells) are formed along the arrangement of the basic cells to supply each cell with the electric power. Likewise, on the wiring layer of the first layer in the cell region, the signal wirings (wirings in a cell) are formed for connection within basic cells. Also, on the wiring layer of the second layer on the basic cells and further on the upper wiring layers (a third layer, fourth layer, etc.), the signal wirings are formed to connect the basic cells.

In this respect, for an ASIC such as this, there is a disclosure, for example, in ISSCC (International Solid-State Circuits Conference) Digest of Technical Papers, pp.88–89, 270, February 1990, and for a standard cell LSI, there is a disclosure, for example, in the "Design of CMOS VLSIs", pp. 275–279, published by Baifukan Co., Ltd., in 1989.

The present inventors have found the following problem in the course of studies on the micro-miniaturization of a semiconductor integrated circuit device formed by the aforesaid ASIC arrangement and the achievement of a higher operational speed of the system.

With the progress in the micro-miniaturization and higher integration of a gate array, the size of basic cells become smaller, and the wiring density of signal wirings and supply wirings arranged in the cell region becomes higher. Then, for example, in a CMOS gate array having circuit elements with MISFETs comprising basic cells in which the supply wirings for cells and wirings in a basic cell are formed on the wiring layer of a first layer, the arrangement of connecting holes (contact hole) to connect the semiconductor region (diffused layer) serving as source and drain regions of the MISFET and the wirings on the first layer is restricted, making it difficult to secure the contact hole in a wide area. As a result, it becomes impossible to obtain a sufficient area for the semiconductor regions and the wirings of the first layer, thus increasing the diffused layer resistance and contact resistance, i.e., the parasitic resistances of the MISFET. This presents the problem of hindering the achievement of a faster operational speed of the circuits.

Also, in order to reduce the size of basic cells for a higher integration, the width of supply wirings for cells and wirings in a basic cell must be miniaturized. Then the current density of the supply wirings for cells formed on the wiring layer of the first layer becomes high, and due to the influence of electromigration, etc., the electrical reliability of the semiconductor integrated circuit is lowered.

In this respect, there is disclosed, for example, in Japanese Patent Laid-Open No. 70542/1988 of Mar. 30, 1988 a technique of reducing the diffused resistance and contact resistance in a semiconductor integrated circuit device with the wirings in a basic cell and supply wirings for cells formed therein. In this publication, the wirings of the first layer and the semiconductor regions serving as source and drain regions of MISFETs are formed against the gate electrode of the MISFET in a self-alignment manner, and are connected through the contact electrodes provided on the gate electrode and the insulating film. At the same time, the circuit design has been made easier by arranging each of the leader electrodes beforehand almost in the entire area over the respective semiconductor regions serving as source and drain regions.

Also, for a "sea of gates" type CMOS gate array, there is disclosed in IEEE JOURNAL OF SOLID-STATE CIRCUITS, pp.1280–1285, VOL. 24, No. 5, October 1989 a technique for connection within basic cells and within logic circuits (macro-cell) composed of basic cells, and for connection between the logic circuits by the wiring layer of a second layer using the area over the basic cells as a wiring region. According to this article, the second-layer wirings extend in parallel with the rows of basic cells, and substantially the whole area over the basic cells is used as wiring regions to increase the number of wiring channels.

On the other hand, as a technique of reducing the above-mentioned diffused layer resistance and contact resistance, there is known a technique of bonding a thin film made of high melting metal such as W, Mo, etc., or its silicide ($WSi_2$, $MoSi_2$, etc.) to the semiconductor regions of MISFETS, i.e., the so-called Saliside technique. However, this technique has a disadvantage that a part of the thin film mentioned above is thrust into the semiconductor region when it is formed thereon, and that there is a tendency to introduce a deep pn junction, thus presenting a problem that its application is not suited for the fabrication process of a highly integrated MISFET which requires an extremely shallow formation of the pn junction (semiconductor region) for the desired miniaturization.

Typically, a semiconductor integrated circuit device using a standard cell system included in the design concept of ASICs is designed and developed in support of an automatic routing system using a computer (DA: Design Automation). The standard cell system is a system such that previously a plurality of types of properly designed macro-cells (functional circuit block) are inputted to a DA, several macro-cells are arranged according to necessity, and these macro-cells are interconnected. Therefore, semiconductor integrated circuit devices using the standard cell system are suitable for small-quantity multi-kind production because the design and development periods are short and the integration degrees and circuit performances are relatively high.

For the semiconductor integrated circuit devices using this type of system, a technique for realizing a high integration degree and high-speed circuit operation was reported in, for example, Section 8.2 "0.8 m 1.4 MTr. CMOS SOG based on Column Macro-cell" CICC (Custom Integrated Circuits Conference) in 1989.

The semiconductor integrated circuit device described in this report has a two-layer wiring structure in which two wirings, i.e., first-layer power supply voltage wiring and first-layer reference-voltage wiring extending in the same first direction spaced from each other and wirings, i.e., second-layer power supply voltage wiring and second-layer reference-voltage wiring extending in the second direction perpendicular to the first direction spaced from each other are arranged. That is, the power supply wirings of the first-layer power supply voltage wiring, first-layer reference-voltage wiring, second-layer power supply voltage wiring, and second-layer reference-voltage wiring are arranged like a grid.

A plurality of basic cells (unit cells) each serving as a basic circuit pattern are repetitively arranged in areas defined and enclosed by the power supply wirings arranged like a grid. Each basic cell comprises a plurality of p-channel MOSFETs (Metal Oxide Semiconductor Field Effect Transistors) connected in series and a plurality of n-channel MOSFETs or a plurality of CMOSs (Complementary MOSs) connected in series. The direction of the gate length of a plurality of n-channel MOSFETs is the same as the extending direction (the second direction) of the second-layer power supply voltage wiring and second-layer reference-voltage wiring.

Interconnection of a plurality of the MOSFETs arranged in the basic cells (wiring in basic cell) is made by the first-layer signal wiring. Power is fed to a plurality of the MOSFETs arranged in the basic cells mainly from either of the second-layer power supply voltage wiring and second-layer reference-voltage wiring.

Adjacent basic cells are interconnected with the first-layer signal wiring (in the same wiring layer) integrated with the first-layer signal wiring used for interconnection in the basic cells. Because the first-layer signal wiring for interconnecting the basic cells is formed in a separate wiring layer independent of the second-layer power supply voltage wiring and second-layer reference-voltage wiring, it can be extended in the direction crossing those wirings. The first-layer signal wiring cannot be extended in the second direction because the first layer power supply voltage wiring and first-layer reference-voltage wiring are arranged in the same wiring layer with the first-layer signal wiring formed. That is, basic cells can be interconnected only in the first direction and a macro-cell having a predetermined logical function can be configured by combining a plurality of basic cells in the first direction.

For intraconnections between the above basic cells, the first-layer signal wiring formed integrally with the first-layer signal wiring used for interconnection in basic cells is used. Therefore, an area where the second-layer signal wiring is formed and which is for connection with the second-layer signal wiring, so-called a wiring channel area is not interposed. That is, in the semiconductor integrated circuit device reported in the above-mentioned art, the wire length between basic cells can be decreased compared with the case that the wiring channel area is provided by omitting the wiring channel area between the basic cells in a macro-cell. Therefore, the signal transmission speed can be increased and the operation of the macro-cell can be accelerated. Moreover, the area occupied by the macro-cell can be decreased and the integration degree can be improved by the decrease in area of the omitted wiring channels between the basic cells.

However, the semiconductor integrated circuit devices to which the above-mentioned art is applied is not considered in view of the following points.

(A) Because the first-layer signal wiring of the above macro-cell is limited in its extending direction and can be extended only in the first direction, basic cells can be interconnected only in the first direction. When designing a macro-cell, a circuit is assigned successively to each basic cell arranged in the first direction. If some unconnected and unused MOSFETs are present in a basic cell, they can be used when basic cells having unused MOSFETs are adjacent to each other or arranged relatively closely to each other.

However, the first-layer signal wiring cannot be extended in the second direction because the first-layer power supply voltage wiring and first-layer reference-voltage wiring are arranged. That is, when unused MOSFETs are present in a basic cell, they are completely useless elements even if unused MOSFETs are not present in adjacent basic cells or those arranged relatively closely to each other and some unused MOSFETs are present in basic cells arranged in the second direction. Therefore, the integration degree of the semiconductor integrated circuit device lowers because the probability that unused MOSFETs are present in a macro-cell increases (the effective availability of elements decreases) and the area occupied by the macro-cell increases.

(B) If many unused MOSFETs are present in a macro-cell, the wiring lengths in basic cells and these between basic cells increase by the extra length necessary when the wiring is laid passing through or away from the unused MOSFETS. Therefore, the signal transmission speed in the macro-cell and the circuit operation speed of the macro-cell decrease.

(C) As the integration degree and operation speed of circuits are improved, the number of MOSFETs arranged in the unit area increases and the power consumption also increases proportionally to the increase of the number of MOSFETS. Therefore, it is required to enhance the power supply capacity. Enhancement of the power supply capacity can simply be settled by increasing the width of each power supply wirings of the first-layer power supply wiring, first-layer reference-voltage wiring, second-layer power supply wiring, and second-layer reference-voltage wiring (that is, by decreasing the current density).

However, because the increase of the power wiring widths decreases the number of MOSFETs arranged in basic cells, the integration degree of the semiconductor integrated circuit device lowers. Also, because the increase of the power wiring width decreases the number of wirings in basic cell and that of wirings between basic cells (number of first-layer signal wires) and increases the number of unused MOSFETs which cannot be interconnected due to lack of the number of wirings (that is, lowers the effective availability of elements), the integration degree of the semiconductor integrated circuit device lowers. Moreover, when the number of wirings in a basic CEll and that of wirings between basic cells are small, it is necessary to provide a wiring channel area in another area. Therefore, the integration degree of the semiconductor integrated circuit device lowers by a degree corresponding to the increase in the area occupied by the wiring channel area.

(D) As the integration degree and circuit operation speed are improved, the number of signal wirings arranged in a unit area increases. Therefore, many cross-talk noises (coupling noises) occur between adjacent signal lines, decreasing the reliability of circuit operation of the semiconductor integrated circuit device.

SUMMARY OF THE INVENTION

An object of the present invention is to provide a technique of reducing the diffused layer resistance and contact resistance to promote a higher operational speed of a logic LSI (semiconductor integrated circuit device) comprising circuit elements with MISFET and a multi-layer wiring structure.

Another object of the present invention is to provide a technique thereby achieving the above object and improving the integration of a logic LSI at the same time.

Still another object of the present invention is to provide a technique thereby achieving the above object and improving the electrical reliability of a logic LSI.

Still other objects of the present invention are:
(A) To increase the speed of circuit operation of ASICs;
(B) To raise the integration degree of ASICs; and
(C) To improve the reliability of circuit operation of ASICs.

The new features and aforesaid and other objects of the present invention will be clear from the description of the present specification and the accompanying drawings.

Of the inventions to be disclosed in the present application, the brief description of the typical ones is given below.

(1) In a semiconductor integrated circuit device comprising cells with circuit elements including MISFETs, and multi-layer connected to predetermined semiconductor regions (source and drain regions: of the MISFET), and a multi-layer wiring structure, the wirings of the first layer are formed substantially in the entire area over the semiconductor regions to shunt the semiconductor regions by the wirings of the first layer, and the supply wirings for cells are formed on the wiring layer of the second layer to supply power to the cells.

Also, the wirings of the first layer and the semiconductor regions are connected through a plurality of contact holes formed in the semiconductor regions or contact holes formed in almost the entire area over the semiconductor regions.

Further, the supply wirings for cells are formed to cover at least part of the semiconductor regions.

(2) In a semiconductor integrated circuit device mentioned in the aforesaid (1), through holes for connecting the wirings of the first layer with those of the second layer are arranged immediately above the contact holes.

(3) In a semiconductor integrated circuit device mentioned in the aforesaid (2), a high melting metal such as tungsten (W) is filled in the contact hole. Also, the wiring layer of the first layer is formed of a high melting metal such as tungsten, while wiring layers of the second and next layers are formed of aluminum film or aluminum alloy film.

According to the aforesaid means (1), it is possible to make the contact area of the semiconductor regions of MISFETs and the wirings of the first layer wider for the reduction of the contact resistance and the diffused layer resistance by shunting the semiconductor regions by the wirings of the first layer through the contact hole opened almost in the entire area over the predetermined semiconductor regions of the MISFET, thus reducing the parasitic resistances of the MISFET. In this case, the supply wirings for cells are formed of the wirings of the second layer in order to prevent lowering the integration, and at the same time, the width of supply wirings for cells is made wider to reduce the wire resistance.

Also, it is possible to reduce the contact resistance of the supply wirings for cells and the semiconductor regions without lowering the integration by connecting the supply wirings for cells formed on the semiconductor regions to the wirings of the first layer through a plurality of through holes or a through hole having a wide opening area.

According to the aforesaid means (2), it is possible to prevent increasing the area of the basic cell and improve the integration by arranging the through hole for connecting the wirings of the first layer with those of the second layer immediately above the contact hole.

According to the aforesaid means (3), it is possible to flatten the surface of the contact hole and arrange the through hole immediately above the contact hole by filling a high melting metal such as tungsten in the contact hole.

Further, it is possible to make the thickness of the wirings of the first layer thin and lessen the base difference on the wiring layers of the upper layers by forming the wiring layer of the first layer with a metal film such as tungsten film which has a stronger electromigration resistance than aluminum film, thus improving the integration with the intensified wiring densities in the basic cell and between the basic cells.

Also, it is possible to reduce the wire resistance by forming the wiring layers of the second and next layers of a metal film which has a lower resistivity such as aluminum film.

(4) In a semiconductor integrated circuit device (ASIC) constituting a macro-cell having predetermined functions, in which a plurality of basic cells including a plurality of MISFETs with the direction of the gate length aligned in the first direction are regularly arranged in the first direction and in the second direction perpendicular to the first direction and all or part of the MISFETs in the above basic cell are interconnected; the MISFETs in each basic cell of the macro-cell are interconnected by first-layer signal wiring arranged in a layer over the gate electrodes of the MISFETs in the basic cell, the basic cells adjacently arranged in the second direction in the macro-cell are interconnected by the first-layer signal wiring extending in the second direction among the above first-layer signal wirings, the basic cells adjacently arranged in the first direction in the macro-cell are interconnected by the second-layer signal wiring extending in the first direction and arranged in a layer upper than the first-layer signal wirings, and power is fed to the MISFETs in each basic cell adjacently arranged in the first direction from the second-layer from the second layer power wiring arranged in the same layer where the second-layer signal wiring is provided and extending in the same first direction. The macro-cell is one of a floating-point operation circuit, integer operation circuit, and store buffer circuit. The macro-cell is constructed by a standard cell system.

(5) The second-layer power supply wiring of the above means (4) has a wiring width approximately equal to the gate width of the MISFETs and extends over the MISFETs in the basic cell in the first direction.

(6) The source or drain regions of the MISFETs in the basic cells of the means (4) or (5) are shunted by the first-layer shunting wiring in the same wiring layer of the first-layer signal wiring for interconnecting the MISFETs in the basic cells.

(7) The first-layer signal wiring of any one of the means (4) through (7) is composed of a refractory metal film and the second-layer signal wiring and second-layer power supply wiring are composed of either of aluminum and aluminum-alloy films or a multilayered film by forming one of a refractor- metal film, a film of alloy of a refractory metal, or a nitride film of a refractory metal on the above aluminum or aluminum-alloy film.

(8) A third-layer signal wiring arranged in a layer higher than the second-layer signal wiring extends in the second direction in a layer higher than the basic cell in the macro-cell of any one of the means (4) through (7), and also a fourth-layer signal wire and fourth-layer power wire extend which are arranged in a layer higher than the third-layer signal wiring and extended in the first direction.

(9) The fourth-layer power supply wiring is formed in a layer over the second-layer signal wiring of the means (8) and the fourth-layer signal wiring is formed in a layer over the second-layer power wiring.

The above means (4) provides the following advantages.

(A) The area occupied by the above macro-cell can be decreased and the integration degree of the semiconductor integrated circuit device can be improved because the first-layer signal wiring in the same layer of the first-layer signal wiring (wirings in the basic cells) for interconnecting MISFETs in each basic cell of the macro-cell is extended in the second direction (that is, the wirings in basic cells are directly used for the wirings between basic cells), signal wirings other than the first-layer signal wirings are arranged between basic cells adjacently arranged in the second direction, and any wiring channel area for connecting the first-layer signal wire with other signal wires is not interposed.

(B) The area occupied by the above macro-cell can be decreased by effectively using basic cells and the integration degree of the semiconductor integrated circuit device can be improved because the second layer signal wiring and second-layer power supply wiring are extended in the first direction, the basic cells arranged in the first direction (or MISFETs in basic cells) are used, circuits can be successively arranged in the first direction, and the probability of occurrence of useless basic cells (or MISFETs in basic cells) i.e. basic cells which are not used as circuits and arranged in the first direction, can be decreased.

(C) The operation speed of the macro-cell can be increased and, resultingly, the operation speed of the semiconductor integrated circuit device can be increased because the length of the first-layer signal wiring extending in the second direction in the macro-cell can be decreased in accordance with the above operation effect (A) and the length of the second-layer signal wiring extending in the first direction in the macro-cell can be decreased in accordance with the operation effect (C).

Using the above means (5), the second-layer power supply wiring is formed in a wiring layer independent of the first-layer signal wiring for interconnecting the MISFETs in basic cells and the width of the second-layer power supply wiring can be increased nearly up to the gate width of the above MISFETs (accurately, up to the allowable distance between terminals at one side and the other of the gate electrode of the MISFET) without restriction by the first-layer signal wiring. Therefore, the resistance of the second-layer power supply wiring is decreased to improve the power-supply noise absorption capacity (resultingly, the circuit-operation waiting time is decreased), and the operation speed of the semiconductor integrated circuit device can be increased.

Using the above means (6), the resistance of the source or drain region of each MISFET in the basic cells can be decreased and the power feed speed or signal transmission speed can be increased. Therefore, the operation speed of the macro-cell and that of the semiconductor integrated circuit device can be increased.

Using the above means (7), the connection resistance between the drain or source region and the second-layer signal wiring or second-layer power supply wiring can be decreased by decreasing the mutual diffusion between Si of the drain or source region of each MISFET in the basic cells and Al of the second-layer signal wiring or second-layer power supply wiring by means of the first-layer signal-wiring serving as an intermediate layer. Therefore, the operation speed of the macro-cell can be increased and, resultingly, the operation speed of the semiconductor integrated circuit device can be increased.

Using the above means (8), the third- and fourth-layer signal wiring for interconnecting basic cells or macro-cells are arranged in an empty area (apparently, within the area occupied by basic cells) over the basic cells and a wiring channel area for arranging the third- and fourth-layer signal wirings between basic cells are omitted. Therefore, the area occupied by the macro-cell or the occupied area between macro-cells can be decreased by the value equivalent to that of the wiring channel area and the integration degree of the semiconductor integrated circuit device can be improved.

Resultingly, the intervals between basic cells in the macro-cell and those between macro-cells can be decreased and the lengths of both the third- and fourth-layer signal wirings can be decreased. Therefore, the signal transmission speed and the operation speed of the semiconductor integrated circuit device can be increased.

Using the above means (9), the interval between the second- and fourth-layer signal wirings can be increased compared with the case in which the fourth-layer signal wiring is disposed above the second-layer signal wiring and crosstalk noise (coupling noises) between the second- and fourth-layer signal wirings can be decreased. Therefore, the reliability of circuit operation of the semiconductor integrated circuit device can be improved.

The configuration of the present invention is described below together with an embodiment in which the present invention is applied to the semiconductor integrated circuit device using a standard cell system included in the design concept of ASIC.

Hereinafter the present invention will be described, in accordance with the embodiments.

In this respect, a member having a same function in each drawing is designated by a same reference and the repeated explanation thereof will be omitted.

DETAILED DESCRIPTION OF THE PREFERRED EMBODIMENTS

Figure 1:
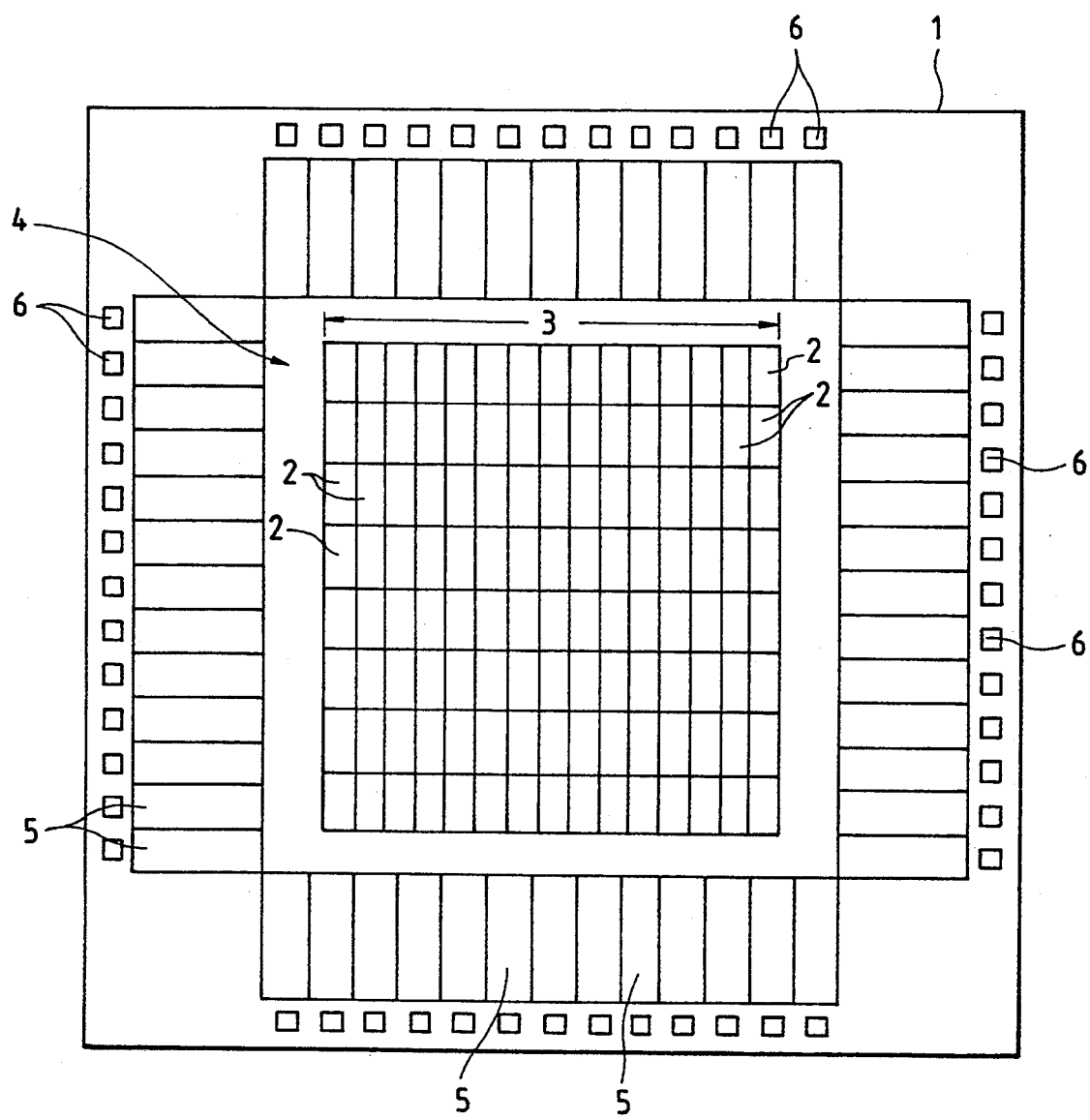
FIG. 1 is a schematic plan view showing the entire structure of a semiconductor integrated circuit device adopting a gate array system according to an embodiment of the present invention.

FIG. 1 is a view showing the entire structure of a semiconductor integrated circuit device according to a first embodiment of the present invention. In this figure, wirings and insulating films between layers are omitted in order to simplify the explanation.

The semiconductor integrated circuit device shown in FIG. 1 has a four-layer wiring structure, for example, and although not particularly limited to, it is a CMOS gate array in which complementary MISFET (CMOS) gates composed of p-channel MISFETs and n-channel MISFETs are uniformly arranged in the center of the main surface of a semiconductor substrate (single-crystal silicon chip) 1. A gate is the basic element of a logic circuit and is also called a basic cell 2. A row of cells 3 is formed of basic cells 2, and column of cells are arranged to form a cell region 4.

The CMOS gate array of the present embodiment is of a type called sea of gates, in which the basic cells 2 are arranged in a matrix in the cell region 4 without a space between cells, and unlike the so-called fixed channel type, it does not include channel regions between the rows of cells. A desired logic circuit is formed by making connections within basic cells 2 and between basic cells 2 through signal lines (not shown).

In this respect, a semiconductor integrated circuit device adopting a sea of gates type of this kind is disclosed, for example in ISSCC Digest of Technical Papers, pp. 72–73, 307; February, 1988.

In the circumference of the cell region 4, I/O cells 5 are successively formed, which function selectively as input buffer, output buffer, or input/output buffer. Further outside thereof, bonding pads 6 are arranged at predetermined intervals on the circumferential part of the substrate 1 for external connection. The I/O cells 5 comprise complementary MISFETs, and constitute input buffers, output buffers or input/output buffers by connecting them with the wirings of the first layer, for example. Also, I/O cells 5 can form an electrostatic breaking circuit and a clamping circuit. Some bonding pads 6 are external power source terminals for receiving power supply from the outside. To the external power source terminals, a source voltage VDD (5 V or 3.3 V, for example) or a grounded voltage Vss (0 V, for example) is supplied. On the wiring layers of the upper layers such as a third layer and fourth layer above the I/O cells 5, source wirings (not shown) are formed to transmit to the inside of the cell region 4 the power supplied to the external power source terminals.

Figure 2A:
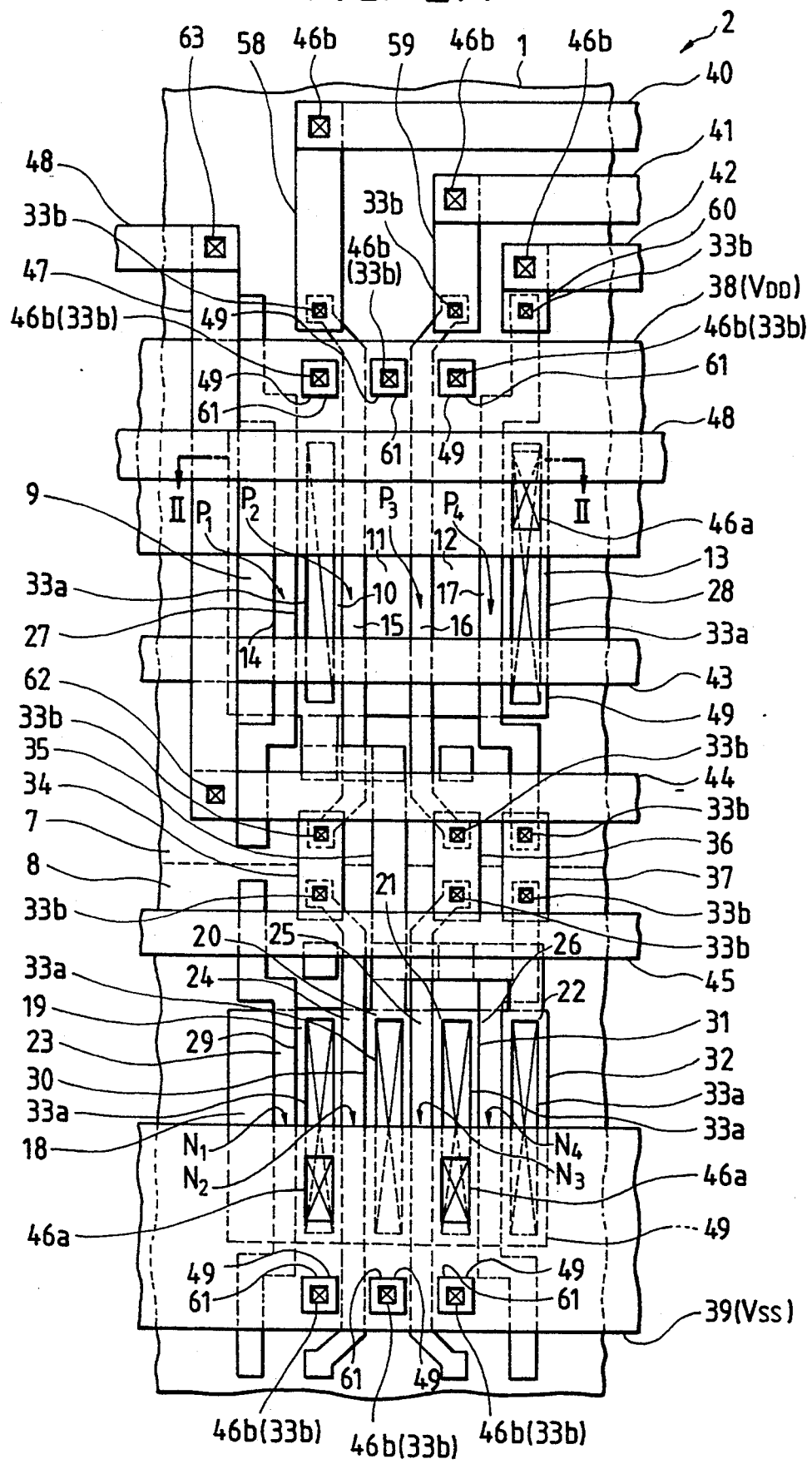
FIG. 2A is a plan view showing the basic cell of this semiconductor integrated circuit device.
Figure 2B:
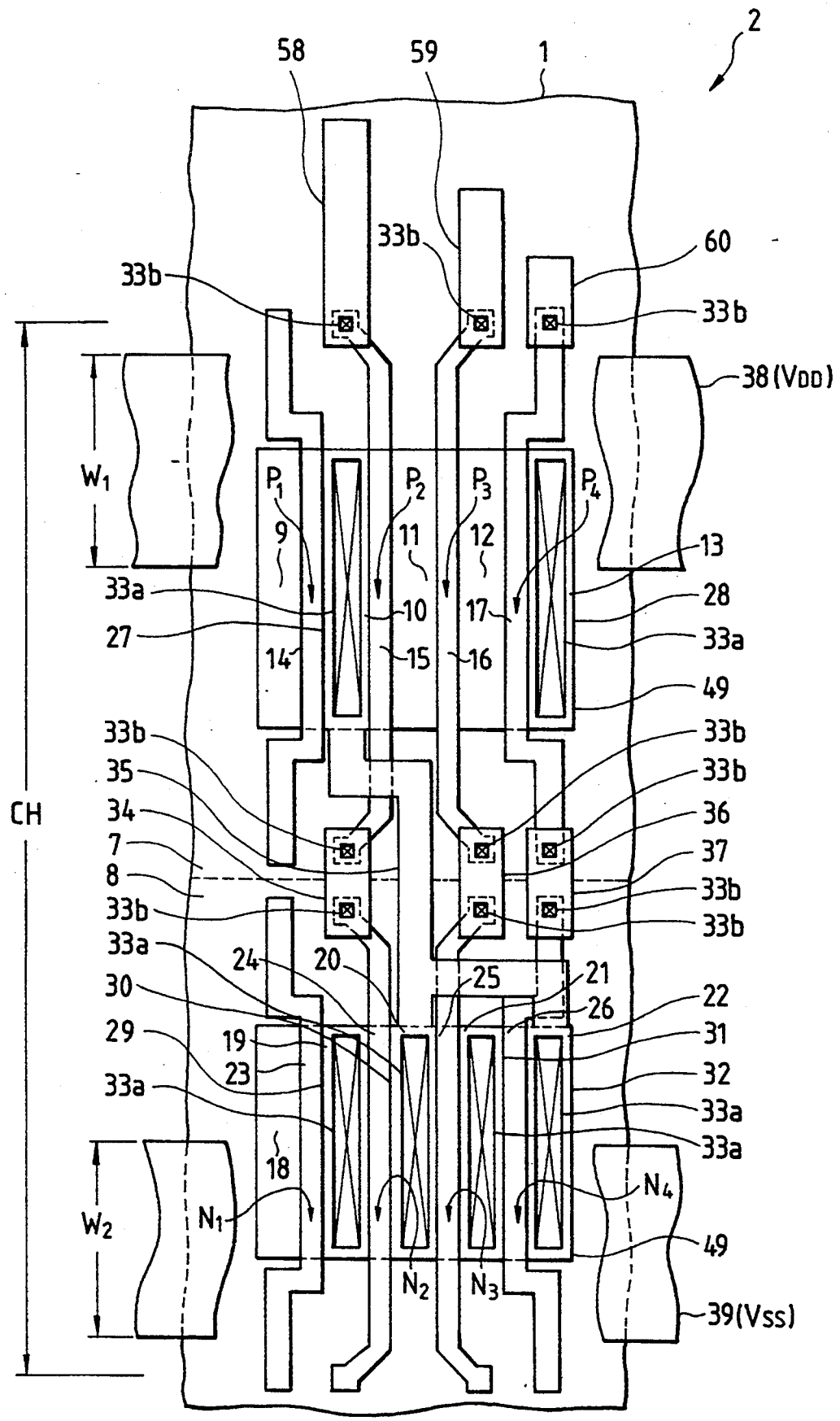
FIG. 2B is a view showing the basic cell shown in FIG. 2A with omission of the wiring layers of the second layer or above except the supply wirings for cells.

FIG. 2A is a view showing the details of the basic cell 2 shown in FIG. 1 and the wiring layers of the upper 2 layers thereof. In this figure, the insulating film provided between each of the wiring layers is omitted to simplify the explanation. Also, FIG. 2B is a view showing the basic cell shown in FIG. 2A with omission of the wiring layers of the second layer or above except the source supply wiring.

The basic cell 2 is formed of complementary MISFETs (CMCSFET) comprising four p-channel MISFETs ($P_1$, $P_2$, $P_3$, and $P_4$) formed on an n type well region 7 and four n-channel MISFETs ($N_1$, $N_2$, $N_3$, and $N_4$) formed on a p-type well region 8. The p-channel MISFEls (p1, p2, p3, and p4) comprise five p-type semiconductor regions 9, 10, 11, 12, and 13 and four gate electrodes 14, 15, 16, and 17 formed interrelatedly in parallel in active region encircled by a filed insulating film 49 at its circumference. The n-channel MISFETs (ni, n21 n31 and n4) comprise five n-type semiconductor regions 18, 19, 20, 21, and 22 and four gate electrodes 23, 24, 25, and 26 formed interrelatedly in parallel in an active region encircled by a field insulating film 49 at its circumference.

The first wiring layer formed oh the upper Layer of the basic cell 2 constitutes the wirings 27–32 (shunt wirings) for shunting each of the predetermined regions of the n-channel MISFET and p-channel MISFET, and the internal wirings for connecting between the insides of the basic cells 2, and the signal wirings 34–37 for connecting between the basic cells. For example, in the case of the basic cell 2 shown ii FIGS. 2A and B, a shunt wiring 27 is connected to the p-type semiconductor region 10 of the p-channel MISFET and a shunt wiring 29 is connected to the p-type semiconductor region 13, respectively. Also, shunt wirings 29, 30, 31, and 32 are respectively connected to the n-type semiconductor regions 19, 20, 21, and 22 of the n-channel MISFET. The shunt wirings 27 aid 28 are respectively connected to each of the p-type semiconductor regions 10 and 13 through a contact hole 33a which is open to almost the entire area over the p-type semiconductor regions 10 and 13. The shunt wirings 29–32 are respectively connected to each of the n-type semiconductor regions 19–22 through a contact hole 33a which is open to almost the entire area over the n-type semiconductor regions 19–22. Each of the contact holes 33a is formed by opening an insulating film 51 which is not shown in FIGS. 2 and 3. Thus the shunt wirings 27–32 and the semiconductor regions 10, 13, and 19–22 are in contact with each other in a wide-area.

Besides, the wirings 34, 35, 36, and 37 and the signal wirings 58, 59, and 60 in the cells are formed by utilizing the wiring channels other than those with the shunt wirings 27–32 formed thereon. The wiring 34 in the cell connects the gate electrode 15 of p-channel MISFET P2 and the gate electrode 24 of n-channel MISFET N2 through the contact hole 33b provided on the insulating film 51. The wiring 36 in the cell connects the gate electrode 16 of p-channel MISFET p 3 and the gate electrode 25 of n-channel MISFET N3 through the contact hole 33b. The wiring 37 in the cell connects the gate electrode 17 of p-channel MISFET P4 and the gate electrode 26 of n-channel MISFET IJ through the contact hole 33b. The wiring in the cell 35 is integrally formed with the shunt wirings 27, 30, and 32 to connect the p-type semiconductor region 10 and n-type semiconductor regions 20 and 22. Meanwhile the signal wiring 5B is connected to the gate electrode 15 of p-channel MISFET P 2 through the contact hole 33b provided on the insulating film 51. The signal wiring 59 is connected to the gate electrode 16 of p-channel MISFET P3 through the contact hole 33b. The signal wiring 60 is connected to the gate electrode 17 of p-channel MISFET P4 through the contact hole 33b.

Thus in the present embodiment, the contact hole 33a is open to almost the entire area over the predetermined semiconductor regions of n-channel MISFET and p-channel MISFET forming the basic cells 2 of the CMOS gate array, and the shunt wirings formed on the wiring layer of the first layer and the predetermined semiconductor regions are connected through the contact hole 33a. As a result, the shunt wirings and the predetermined semiconductor regions are in contact with each other in a wide area, so that the contact resistance and diffused layer resistance are reduced. Hence the parasitic resistances of the MISFET can be reduced to promote a higher action of the CMOS gate array.

There are formed on the wiring layer of the second layer above the wiring layer of the first layer, the power supply wiring 38 for supplying the source voltage VDD to the predetermined p-channel MISFET and n-type well region 7 of the basic cell 2, and the power supply wiring 39 for supplying the grounded voltage Vss to the predetermined n-channel MISFET and p-type well region 8 of the basic cell 2. Also the signal wirings 40–45 are formed using the wiring channels other than those with the supply wirings 38 and 39 to connect the basic cells. A pair of the supply wirings 38 and 39 comprise the wirings which are wider than the signal wirings 40–45, and extend in parallel with the row of cells 3 shown in FIG. 1. Also, the supply wiring for the cell 38 (VDD)'s formed to cover at least a part of the p type semiconductor regions 10–13 serving as the source and drain regions of the p-channel MISFETs (p1, P2, P3 and P4). Likewise, the supply wiring 39 (VSS) is formed to cover at least a part of the p-type semiconductor regions 19–22 serving as the source and drain regions of the n-channel MISFETs ($n_1$, $n_2$, $n_3$, and $n_4$). The signal wirings 43, 44, and 45 are formed between a pair of the supply wirings for cells 33 and 39 and used mainly for the wirings within the cells of the logic cells formed by the basic cells 2. In the present embodiment, the signal wirings 43–45 are provided between a pair of the supply wirings for the cells 38 and 39 to improve the flexibility of the supply wirings for the cells for a better integration. Therefore, as shown in FIG. 2B, each of the wires $w_1$ and $w_2$ of the supply wirings for the cells 38 and 39 is defined to be approximately a ¼ of the cell width CH to reduce the wire resistance of the supply wirings 38 and 39. Consequently the defective caused by electromigration can be reduced and at the same time, the integration can be improved. In this respect, it may also be possible to reduce significantly the wire resistance of the supply wirings 38 and 39 by forming each of the supply wirings 38 and 39 to cover each of the entire areas of the semiconductor regions 10–13 and 19–22. In this case, each of wires $w_1$ and $w_2$ of the supply wirings 38 and 39 should be defined to be approximately a ¼ or more of the cell width CH.

As shown in FIG. 2A, the supply wiring 38 (VDD) is connected to the shunt wiring 28 through the through hole 46a. In other words, the supply wiring 38 is connected to the p type semiconductor region 13 through the through hole 46a, shunt wiring 29 and contact hole 33a. Similarly, the supply wiring for the cell 39 ($V_{ss}$) is connected to each of the shunt wirings 29 and 31 through the through hole 46a. In other words, tie supply wiring for the cell 39 is connected to the n-type semiconductor region 19 through the through hole 46a, the shunt wiring 29 and contact hole 33a, and is connected to the n-type semiconductor region 21 through the through hole 46a, shunt wiring 31, and contact hole 33a. The through hole 46a is arranged immediately above the contract hole 33a for connecting the supply wirings 38 and 39 and the shunt wirings (27, 28, 29, and 31). Also, as shown in FIG. 2A, the through hole 46a is formed almost in the entire area of the regions where the supply wirings for cells 38 and 39 are overlapped with the shunt wirings.

The supply wiring 38 (VDD) also supplies current to the n-type well region 7 through the through hole 46b. The supply wiring 38 supplies current to the n-type well region 7 through the contact hole 33b which is formed by opening the insulating film 51 to extend itself to the n-type well region 7, the shunt wirings 61 formed on the wiring layer of the first layer, and the through hole 46b formed on the shunt wirings 61. Similarly, the supply wiring 39 (Vss) supplies power to the p-type well region 8 through the through hole 46b. The supply wiring 39 (VSS) supplies power to the p-type well region 8, the contact hole 33b formed by opening the insulating film 51 to extend itself to the p-type region 8, the shunt wirings 61 formed on the wiring layer of the first layer, and the through hole 46b formed on the shunt wirings 61. The through hole 46b for connecting the supply wirings 38 and 39 and the shunt wirings 61 is arranged immediately above the contact hole 33b.

The signal wiring 40 is connected to the signal wiring 58 on the first layer through the through hole 46b. Each of the signal wirings 41 and 42 is connected to each of the signal wirings 59 and 69 on the first layer through the through hole 46b. The signal wirings on the second layer are mostly arranged extendedly in parallel in the direction of the row.

Thus in the present embodiment, the signal wirings 40–45 are formed on the wiring layer of the second layer to connect the supply wirings 38 and 39 and the basic cells. Then the through hole 46a for connecting the supply wirings 38 and 39 and the shunt wirings is arranged immediately above the contact hole 33a, and an electric potential is supplied to the semiconductor regions through the through hole 46a, shunt wirings, and contact hole 33a. Hence the size of the basic cell 2 can be made smaller to improve the integration of the CMCE gate array and at the same time and to reduce the contact resistance between the supply wirings 38 and 39 and semiconductor regions, thus making it possible to improve the operational speed of the system.

On the wiring layer of the third layer which is the upper layer of the second layer, the signal wiring 47 is formed to connect each of the basic cells. The signal wiring 47 is formed in the direction perpendicular to the supply wirings 38 and 39 and the signal wirings 40–45 formed on the wiring layer of the second layer. The signal wiring 47 is connected to the signal wiring 44 of the second layer through the through hole 62.

A signal wiring 48 is formed on the wiring layer of the fourth layer, which is the upper layer of the third layer, to connect the basic cells. The signal wiring 48 is formed in the direction perpendicular to the signal wiring 47 formed on the wiring layer of the third layer. In other words, the signal wiring 48 is formed in parallel with the supply wirings 38 and 39 and the signal wirings 40–45 formed on the wiring layer of the second layer. The signal wiring 48 is connected to the signal wiring 47 on the third layer through the through hole 63.

The signal wirings on the wiring layers of the fourth layer and third layer are used for the signal wirings for connecting the logic cells comprising mainly the basic cells.

Figure 3:
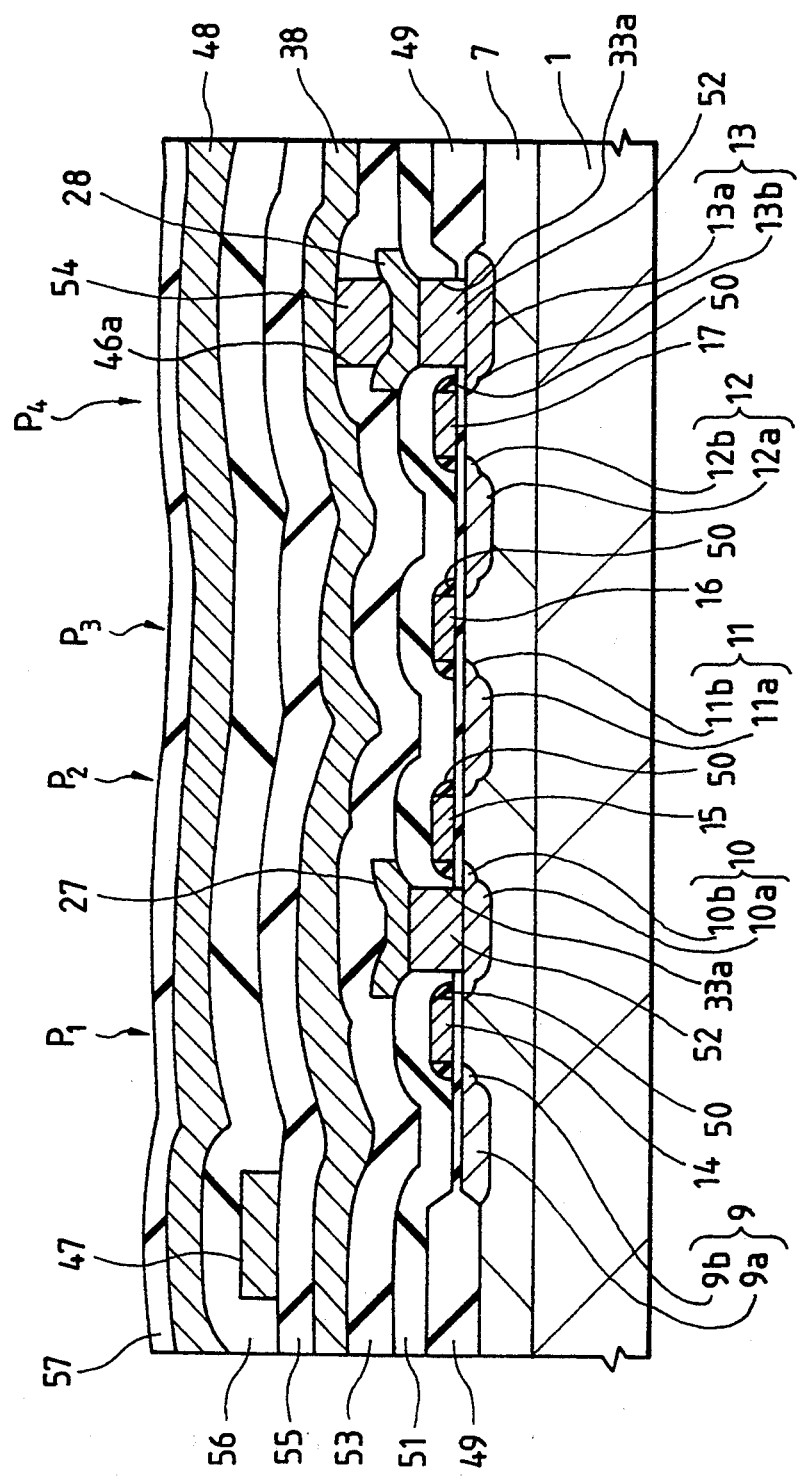
FIG. 3 is a cross-sectional view along a line II—II in FIG. 2A.

FIG. 3 is a cross-sectional view showing the basic cell 2 along the line II—II in FIG. 2A.

In the active region encircled at its circumference by the field insulating film 49 on the main surface of n type well region 7 on the semiconductor substrate (chip) 1 of p-type single-crystal silicon, p-channel MISFETs ($P_1$, $P_2$, $P_3$, and $P_4$) are formed comprising five p-type semiconductor regions 9, 10, 11, 12, and 13 and four gate electrodes 14, 15, 16, and 17.

Each of the p-type semiconductor regions 9, 10, 11, 12, and 13 has so-called LDD (Lightly Doped Drain) structure comprising p+ type semiconductor region 3, 9a, 10a, 11a, 12a, and 13a in which p-type impurity is introduced in a high concentration, and p-type semiconductor regions 9b, 10b, 11b, 12b, and 13b in which p-type impurity is introduced in a low concentration. Each of the gate electrodes 14, 15, 16, and 17 comprises a conductive film made of Low resistance polysilicon or a conductive compound film (polycide) formed by stacked layers of the above-mentioned low resistance polysilicon and silicide ($Wsi_2$, $MoSi_2$, etc.). On the side wall of each of the gate electrodes 14, 15, 16, and 17, a side wall spacer 50 is provided to form the LDD structure.

The side wall spacer 50 is made of silicon dioxide film, for example.

To the p-type semiconductor region 10, the shunt wiring 27 is connected through the contact hole 33a formed by opening a part of the insulating film 51 stacked on the upper layer of the p-channel MISEETs ($P_1$, $P_2$, $P_3$, and $P_4$). To the p-type semiconductor region 13, the shunt wiring 28 is connected through the contact hole 33a formed by opening a part of the insulating film 51. The shunt wirings 27 and 28 are made of a high melting metal film such as tungsten film, etc. The inside of each of the two contact holes 33a is filled with tungsten film 52 to flatten its upper face. The filling of tungsten film 52 is performed by a selective CVD system, or the filling can also be performed by etching back the tungsten film stacked on the entire area of the insulating film 51.

Thus in the present embodiment, the upper face of the contact hole 33a is flattened by filling tungsten film 52 in its inside, so that the through hole 46a for connecting the shunt wirings 27 and 28 and the supply wiring for cells 38 can be arranged immediately above the contact hole 33a.

On the upper layer of the wiring layer of the first layer where the shunt wirings 27 and 28 are formed, a first layer insulating film 53 is stacked.

Also, the wiring layer of the first layer is formed of a tungsten film which is stronger than aluminum alloy film in electromigration resistance, so that the thickness of wiring on the wiring layer of the first layer can be made thin as compared with the wiring made of aluminum alloy film, thus making it possible to improve the surface flatness of the first layer insulating film 53. As a result, the stage differences in the wiring layers of the second layer or above can be reduced to improve the electrical reliability of those wiring layers.

The shunt wirings 27 and 28 are formed on the contact hole 33a, the upper face of which is flattened by filling of the tungsten film 52. Therefore, the stage difference between the layer insulating film 53 on the shunt wirings 27 and 28 and the layer insulating film 53 on the insulating film 51 is extremely small.

To the shunt wiring 28, the supply wiring 38 is connected through the through hole 46a formed in a layer insulating film 53. The supply wiring 38 formed on the wiring layer of the second layer is made of aluminum alloy film, for example. In the inside of the through hole 46a, tungsten film 54 is filled in to flatten its upper face. The filling of the tungsten film 54 is performed by use of a selective CVD method, it can also be performed by etching back the tungsten film stacked on the layer insulating film 53. The supply wiring for cells 38 is formed on the through hole 46a, the upper face of which flattened by the filling of the tungsten film 54. Therefore, the stage difference thereof is extremely small.

On an upper layer of the wiring layer of the second layer on which the supply wiring for cells 38 is formed, a second layer insulating film 53 is stacked, and on the an upper layer of the layer insulating film 55, the signal wiring 47 is formed. On an upper layer of the wiring layer of the third layer on which signal wiring 47 is formed, a third layer insulating film 56 is stacked, and on the upper layer of the layer insulating film 56, the signal wiring 48 is formed. On an upper layer of the wiring layer of the fourth layer on which the signal wiring 48 is formed, a surface protecting film (passivation film) 57 is stacked.

Also, the insulating film 51, and layer insulating films 53 and 55 are formed, for example, with a single layer of Silicon dioxide film, BPEG (Boron-doped Phospho-Silicate Glass) film, silicon nitride film, etc. or a compound film of these films.

Thus, the wiring layers of the second layer or above and the supply wiring for cells, which are comparatively long in the wiring length, are formed of a low resistant material such as aluminum alloy film, thereby reducing the wire resistance to improve the operational speed of the system to be mounted.

The invention designed by the present invertor has been described in detail with reference to &n embodiment as above. However, the present invention is not limited to the aforesaid embodiment, and it is needless to mention that various modifications are possible without departing from the purport thereof.

Figure 4A:
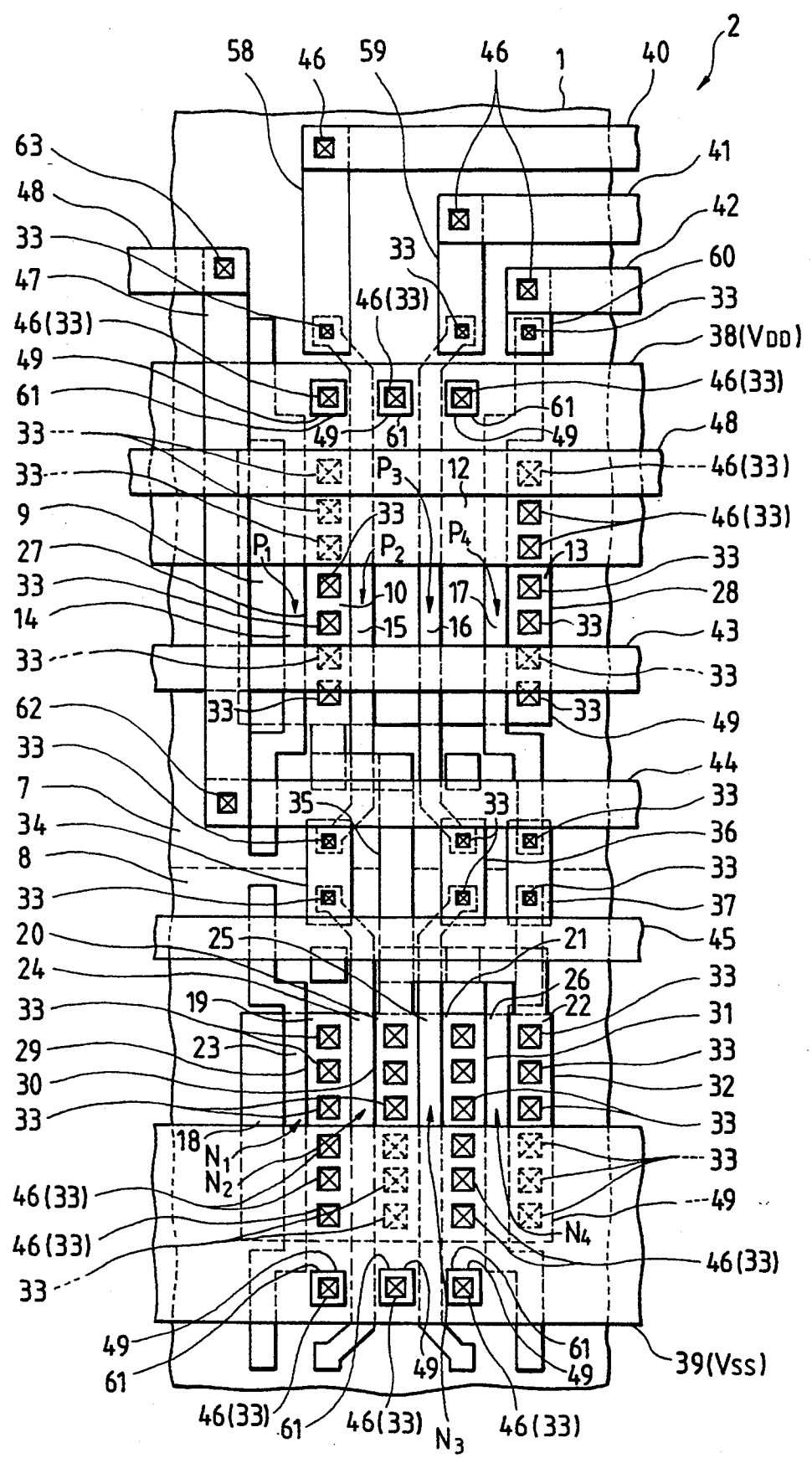
FIG. 4A is a plan view showing the basic cell of a semiconductor integrated circuit device according to another embodiment of the present invention.

In the aforesaid embodiment, the semiconductor regions are shunt by the first layer wiring through a large-diameter contact hole which is open almost over the entire area of the predetermined semiconductor regions of MISFET. For example, however, the shunt wiring (27–32) formed on the wiring layer of the first layer can be connected to each of the predetermined regions (10, 13, and 19–22) through many contact holes 33 of small diameter which are open almost over the entire area of the semiconductor regions (10, 13, and 19–22) of MISFET as shown in FIG. 4A. In this case, too, the through hole 46 for connecting the shunt wiring (27–32) and the supply wiring 38 and 39 formed on the wiring layer of the second layer can be formed immediately above the small-diameter contact holes 33.

Figure 4B:
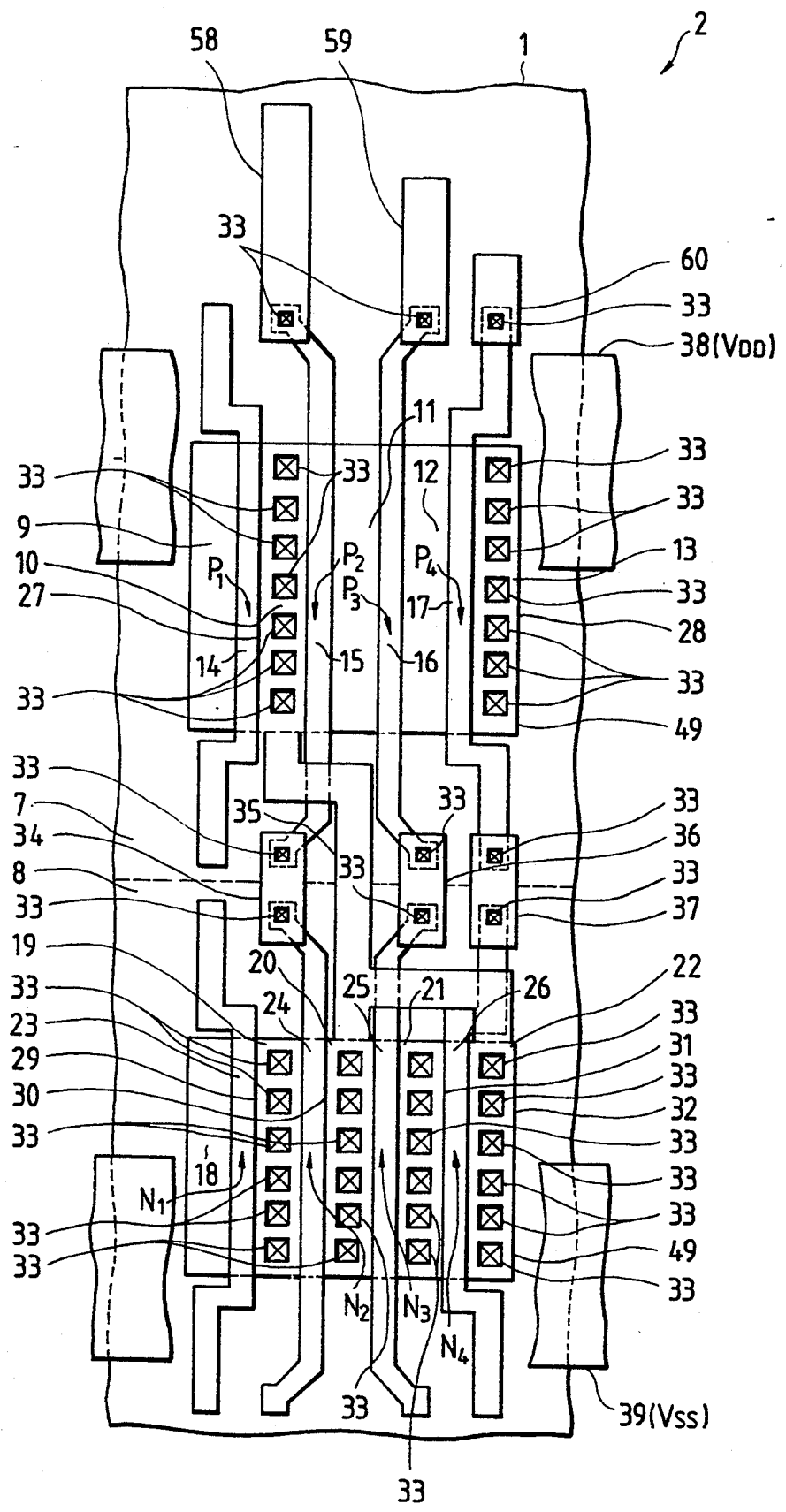
FIG. 4B is a view showing the basic cell shown in FIG. 4A with omission of the wiring layers of the second layer or above except the supply wiring for cells.

In this respect, FIG. 4B is a view showing the basic cell shown in FIG. 4A with omission of the wiring layers of the second layer or above except the supply wiring 38 and 39.

In this way, when these contact holes 33 are formed, the aspect ratio of all the contact holes can be made equal by arranging the contact holes 33 in the same size, and so-called microloading effect can be reduced. Hence the reliability of electrical connections in the section of contact holes 33 can be improved.

Figure 5A:
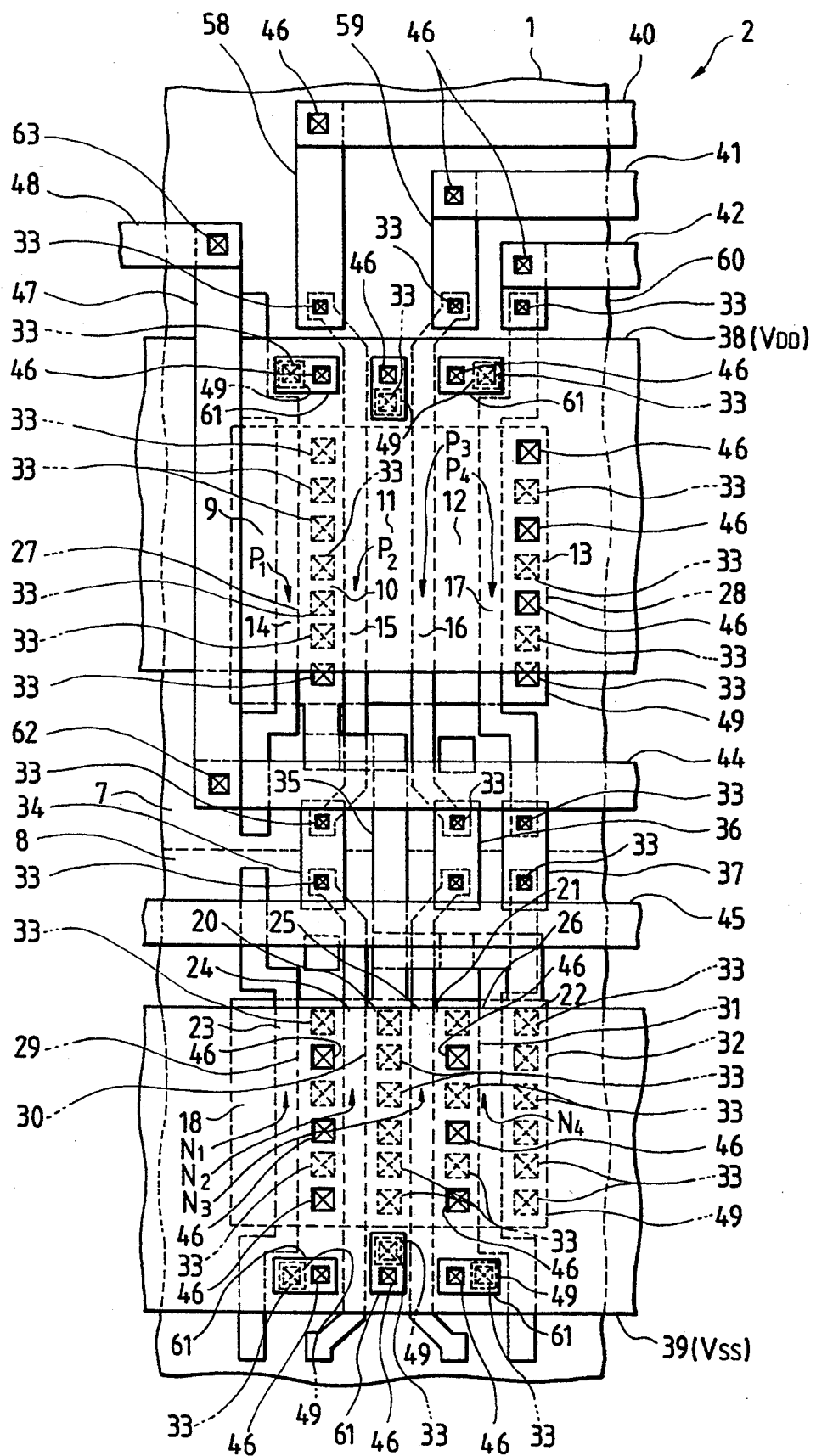
FIG. 5A is a plan view showing the basic cell of a semiconductor integrated circuit according to still another embodiment of the present invention.
Figure 5B:
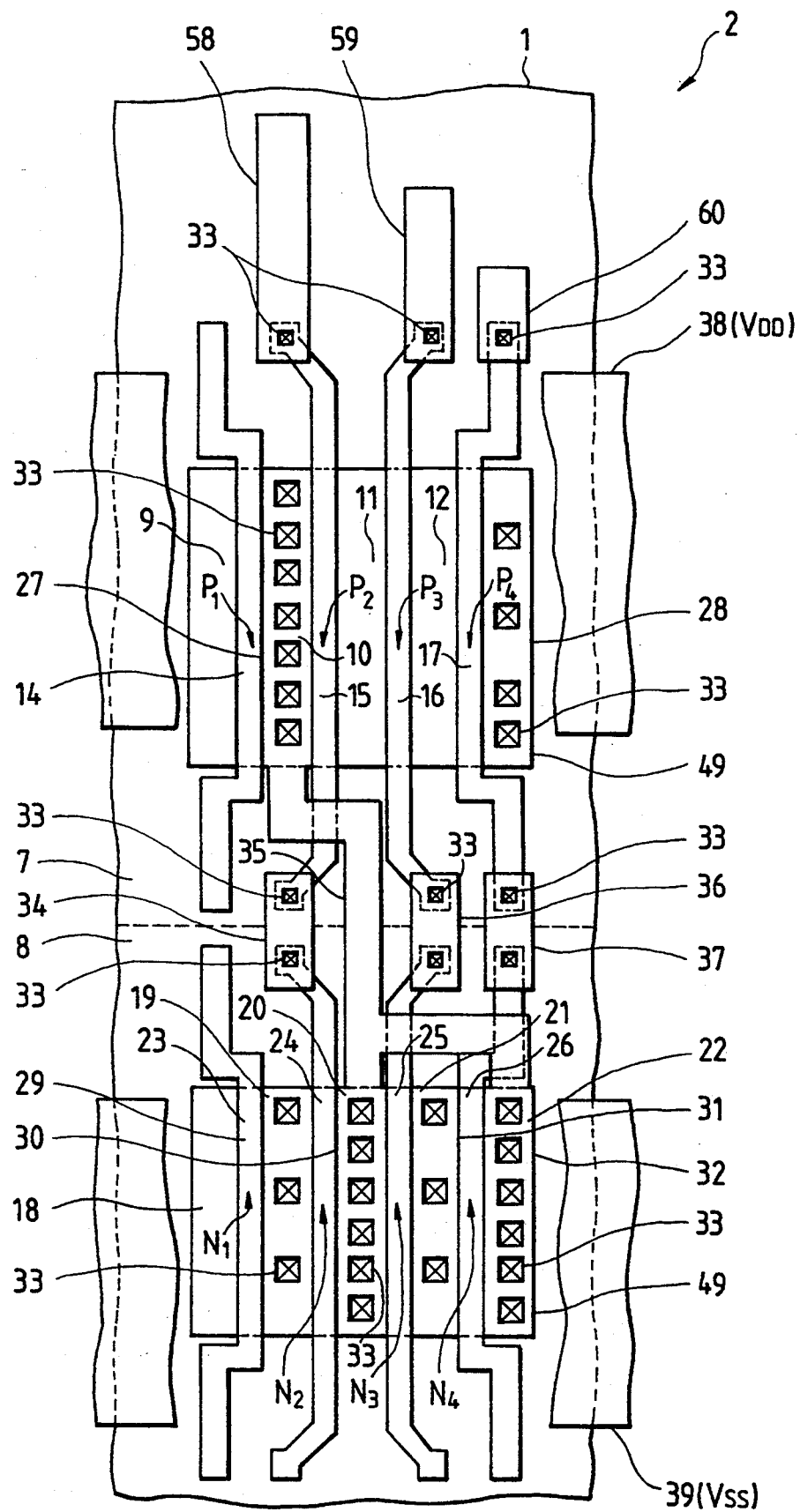
FIG. 5B is a view showing the basic cell shown in FIG. 5A with omission of the wiring layers of the second layer or above except the supply wiring for cells.

Also, in FIGS. 4A and B, although the through holes 46 are formed immediately above the contact holes 33, the formation is not limited to this arrangement. As shown in FIGS. 5A and 3, the through holes 46 and contact holes 33 can be formed alternatively at the positions adjacent to each other. In this respect, FIG. 5B is a view showing the basic cell shown in FIG. 5A with omission of the wiring layers of the second layer or above except the supply wiring 38 and 39. Also, the supply wiring 38 and 39 can be formed to cover almost the entire area of the semiconductor regions. Thus it is possible to reduce the wire resistance of the supply wiring 38 and 39 and the contact resistance between the supply wiring 38 and 39 and the semiconductor regions at the same time.

The CMOS gate array in the aforesaid embodiment takes the sea of gates system but it is not necessary limited to such system. A fixed channel system may also be adoptable.

Also, the present invention is not limited to the application of the CMOS gate array only. It can be applicable to BI-CMOS as a matter of course.

Figure 6A:
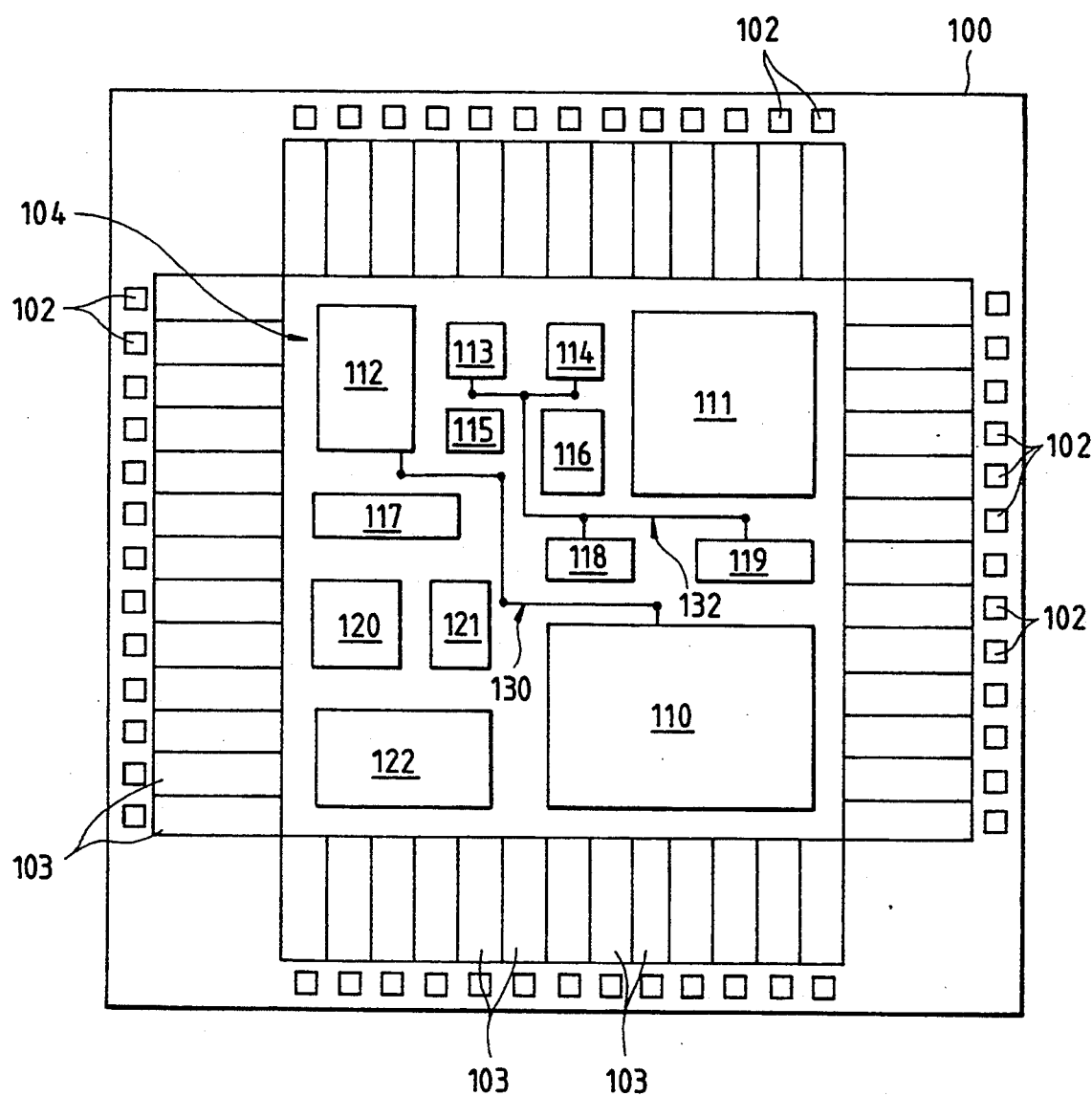
FIG. 6A is a schematic plan view showing the entire structure of a semiconductor integrated circuit device adopting a standard cell system according to another embodiment of the present invention.
Figure 6B:
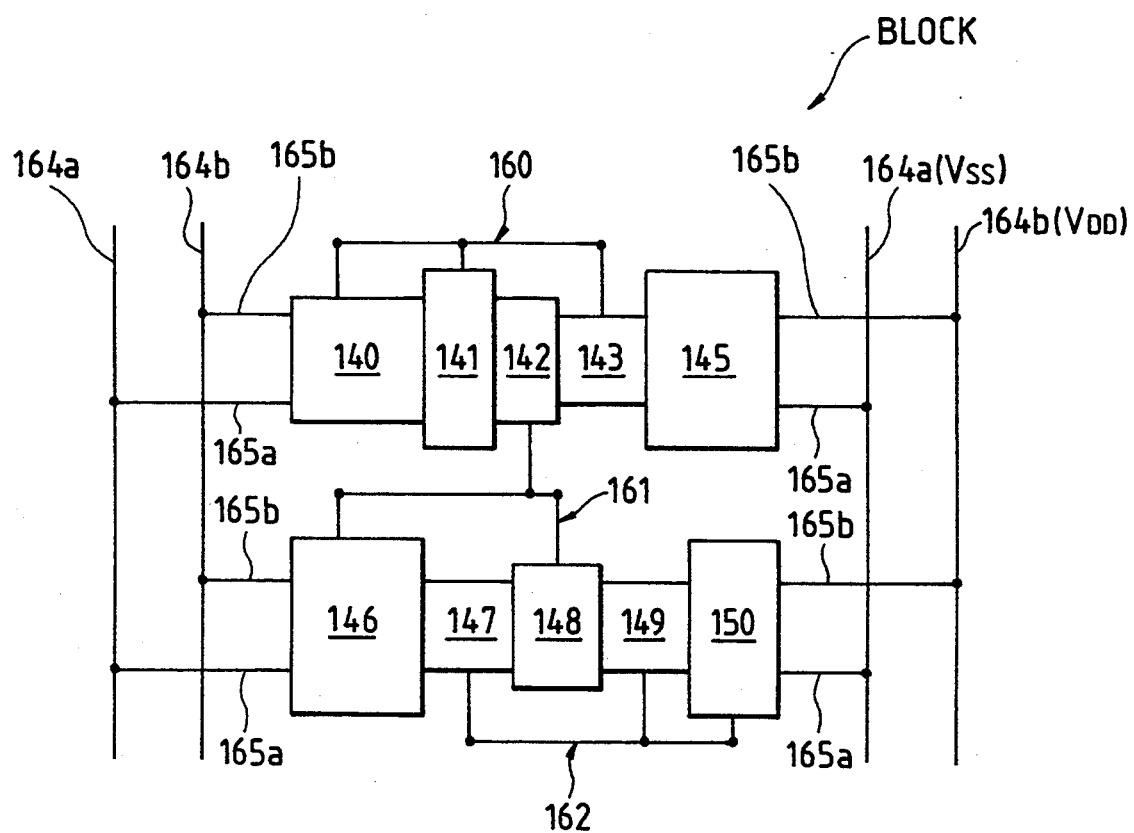
FIG. 6B is a view showing blocks of this semiconductor integrated circuit device.

FIGS. 6A and 6B (chip layout drawing) are schematic views showing the structure of a semiconductor integrated circuit device adopting the standard cell system according to another embodiment of the present invention.

As shown in FIG. 6A, the semiconductor integrated circuit device 100 adopting the standard cell system is structured in a square plane. This semiconductor integrated circuit device 100 is constructed on a single-crystal silicon substrate.

In the circumferential region along each side of the square plane of the semiconductor integrated circuit device 100, a plurality of external terminals (bonding pads) 102 are arranged. in the inner region of the external terminals 102 of the semiconductor integrated circuit device 100, input/output buffer circuits 103 are arranged. Each input/output buffer 103 may correspond to one or more external terminals 102.

In the inner region 104 of the input/output buffer circuits 103 of the semiconductor integrated circuit device 100, a plurality of blocks 110–122 are arranged. The blocks 110–122 constitute a system to be mounted in the semiconductor integrated circuit device 100. The blocks 110–111 are a logic macro-cell and a ROM, for example. The blocks 112–122 are random blocks, such a group of registers, memory management unit, bus controller, etc. In this respect, in a case of RISC (Reduced Instruction Set Computer) processor system, for example, the blocks 110–122 include data cache memory, instruction cache memory, RISC type CPU core, etc.

Blocks 112–122 are the macrocell structured as a functional block or circuit block.

Blocks 112–122 are connected with each other by the wiring 130 and 132 formed using the wiring layers of the second, third, and fourth layers.

As shown in FIG. 6B, the random blocks 111–122 are structured by a plurality of logic cells 140–150, for example. These logic cells are composed of NAND circuits, OR circuits, flip-flop circuits, inverter circuits, adder and driver circuits, etc. comprising CMOS and BI-CMOS elements. The wiring in each block (wiring between logic cells) are mainly connected by the wiring 160–162 formed using the wiring layers of the first, second and third layers. The wiring on the third layer are, though not limited to, used for wiring within a block in a case of the large scale block with many logic cells therein, for example.

Also, to the logic cells, power is supplied through the wiring layer of the third layer 164a ($V_{ss}$) and 164b ($V_{DD}$) and the wiring layer of the second layer 165a ($V_{ss}$) and 165b ($V_{DD}$).

These logic cells and macrocells are registered in a library. Also, the design of a new block (macrocell) required to construct a system is made mainly by the use of the logic cells registered in the logic cell library.

Figure 7A:
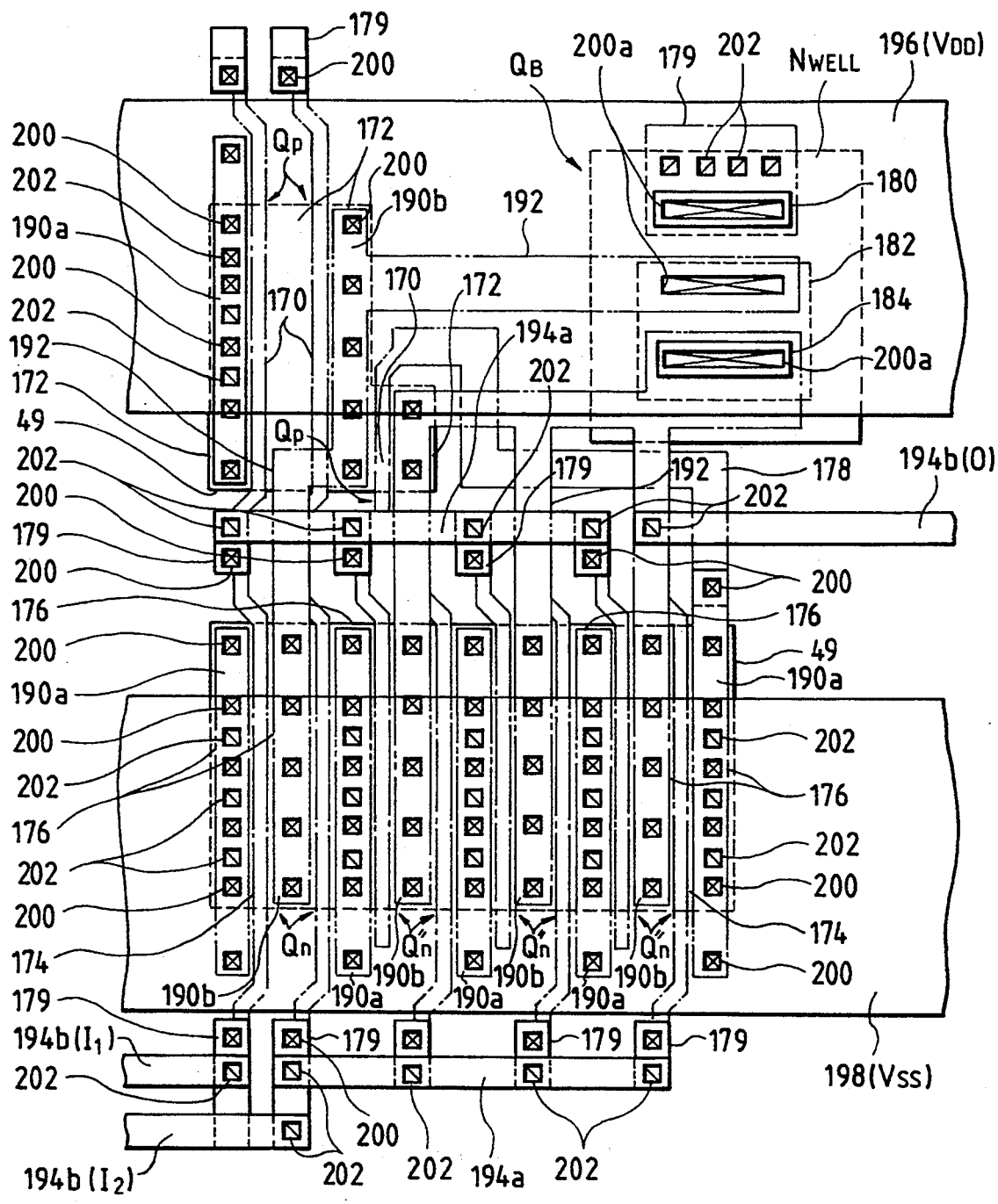
FIG. 7A is a plan view showing an example of the logic cell of the semiconductor integrated circuit device shown in FIG. 6A.
Figure 7B:
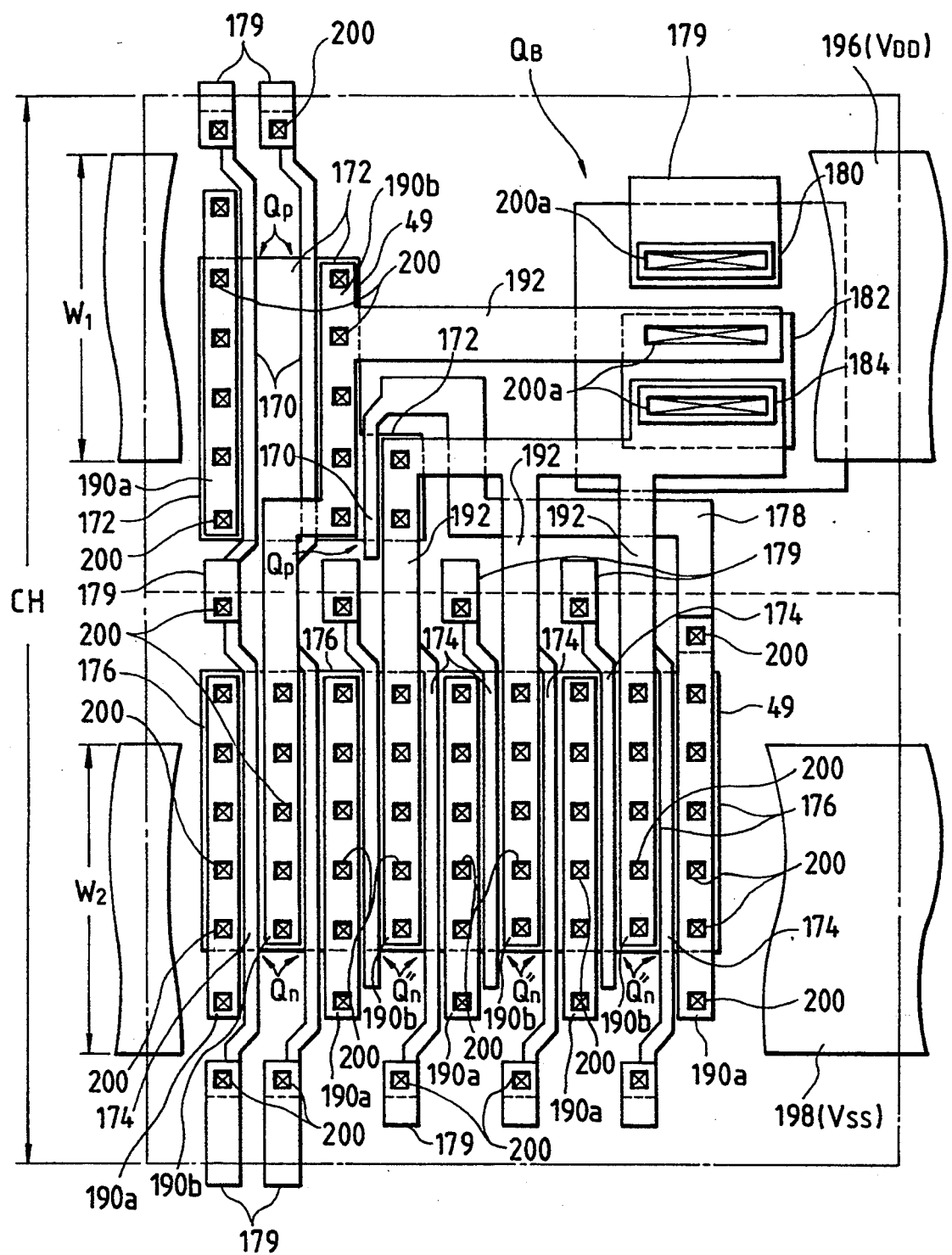
FIG. 7B is a view showing the logic cell shown in FIG. 7A with omission of the wiring layers of the second layer or above except the supply wiring for cells.
Figure 7C:
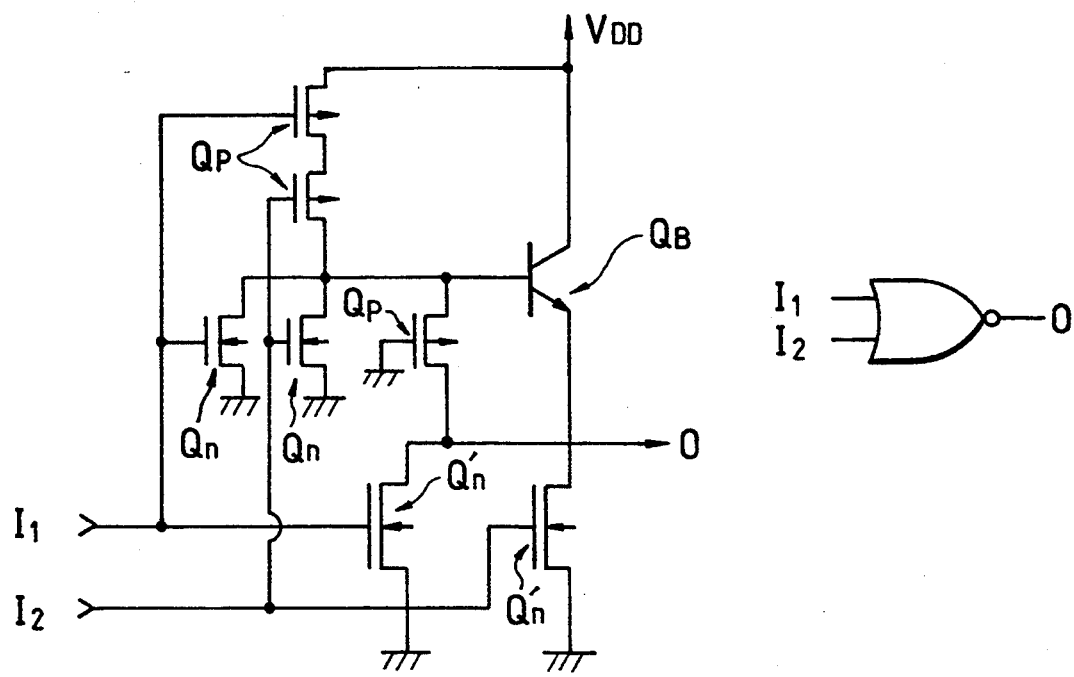
FIG. 7C is a schematic view showing the equivalent circuit shown in FIG. 7A.

FIG. 7A illustrates an example of the logic cell. FIG. 7A is a plan view showing a two-input NOR circuit comprising BI-CMCS. FIG. 7C is a schematic view showing its equivalent circuit. Also, FIG. 7B is a view showing the logic cell shown in FIG. 7A with omission of the wiring layer of the second layer except the source power wiring.

The p-channel MISFET Qp is formed in a region surrounded by the field insulating film 49, and it includes a gate insulating film, a gate electrode 170, and a pair of p+ type semiconductor regions 172 serving as the source and drain regions. The n-channel MISFETs Qn and Qn'' are formed in a region surrounded by the field insulating film 49, and it includes a gate insulating film, a gate electrode 174, and a pair of n+ type semiconductor regions 176 serving as the source and drain regions. The n-channel MISFET Qn shown in FIG. 7C corresponds to the three n-charnel MISFETs Qn'' formed in parallel in FIGS. 7A and C.

One p+ type semiconductor region 172 of the p-channel MISFET Qp is integrally formed with the other p+ type semiconductor region 172 of the other p-channel MISFET Qp adjacent thereto in the longitudinal direction of the gate. In other words, the three p-channel MISFETs Qp are connected with each other in series without the field insulating film 49. Likewise, one n+type semiconductor region 174 of the n-channel MISFETs Qn and Qn'' is integrally formed with the other n+type semiconductor region 174 of the other MISFET Qn and Qn'' adjacent thereto in the longitudinal direction of the gate. In other words, the eight n-channel MISFETs Qn and Qn'' are connected with each other in series.

$Q_B$ designates a bipolar transistor. A numeral 180 denotes collector region; 182, base region; and 184, emitter region.

The wirings in the logic cell are formed mainly of the wiring layer of the first layer and that of the second layer. The wiring layer of the first layer mainly comprises the semiconductor region 172 of p-channel MISFET, the wiring (shunt wiring) 1SOa and 190h for shunting the semiconductor region 176 of n-channel MISFET, and the wiring 192 in the logic cell. The shunt wiring 190b is formed integrally with the wiring 192. The wiring of the first layer 190a and 190b and 192 are connected to the semiconductor regions 172 and 176 and the gate electrode 174 through the contact holes 200 and 200a. The wiring in logic cell 194a formed of the wiring layer of the second layer is connected to the wiring of the first layer 179 through the contact hole 202. A numeral 178 denotes the wiring in logic cell formed on the same layer of the gate electrode and formed integrally therewith.

Thus in the present embodiment, a plurality of contact holes 200 are open almost over the entire area of the predetermined regions 172 and 176, and the shunt wiring 190a and 190b formed on the wiring layer of the first layer and predetermined semiconductor regions 172 and 176 are connected through the contact holes 200. In this way, it is possible to reduce the contact resistance and diffused resistance the Eame as aforesaid embodiment.

The wiring layer of the second layer is usedin the block mainly for the wiring 194b between the logic cells and the supply wiring 196 ($V_{DD}$) and 198 ($V_{ss}$) in addition to the wiring 194a in the logic cell.

The pair of supply wiring 196 and 198 for cells extend in parallel in the direction of the row (perpendicularly to the direction in which the gate electrode 174 extends). The supply wiring 196 and 198 are wider than the wiring 194a in the logic cell to cover at least part Of the semiconductor regions 172 and 176.

Each of the wiring width $w_1$ and $w_2$ of the supply wiring 196 ($V_{DD}$) and 198 ($V_{ss}$) for cells is approximately ¼ of the cell width CH of the logic cell or greater. Thus in the present embodiment the width ($w_1$ and $w_2$) of the power supply line in the logic cell is approximately a ½ of the cell width CH. The supply wiring 196 and 198 for cells are connected to the shunt wiring 190a and b through the through hole 202.

The through holes 202 for connecting the supply wiring 196 and 198 for cells and the shunt wiring 190a and b are arranged, though not limited to, at alternative positions to the positions of the contact holes 200 when viewed horizontally. Also, the through hole 202 and contact hole 200 are provided substantially in the same size.

Between the pair of the supply wiring 196 and 198 for cells, the second layer wiring 194a and b are formed to connect between the logic cells and the inside of a logic cell. The second layer wiring 194a and b extend in parallel in the direction of row. Thus in the present embodiment, the supply wiring 196 and 198 for cells, the wiring in logic cell 194a and the wiring between the logic cells (wiring in a block) 194b are formed on the wiring layer of the second layer in a block. Thus, the same effect of the aforesaid embodiment can also be obtained. In other words, the shunt wiring 190b and the wiring in logic cell 192 can be formed integrally to reduce the contact resistance. At the same time, it is possible to use the wiring layer of the second layer for the wiring 194a for a higher integration without increasing the size of the basic cell.

Also, in the block, though not necessarily limited to, each of the wiring layers of the first layer, second layer and third layer is formed with a same wiring pitch (1–3 μm) and a same wiring width (0.5–1.5 μm). Each of the wiring layers of the second and third layers to connect the blocks is formed with a wider wiring pitch and wider wiring width than each of the wiring layers of the second and third layers in the block. Thus in a same wiring layer, the wiring pitch and wiring width can be varied for the signal wiring in block and the signal wiring for connecting blocks to prevent increasing CR constant of the signal wiring for connecting the blocks which are longer than the wiring in block in the wiring length, so that the operating speed of the system can be improved.

Also, the supply wiring for blocks for supplying source powers ($V_{DD}$ and $V_{ss}$) to each block are formed mainly on the wiring layers of the third layer and fourth layer. The signal wiring on the fourth layer to connect the blocks are formed in the wiring pitch of 3–5 μm and wiring width of 2–4 μm, though not necessarily limited thereto. Also, the wiring thicknesses of the wiring on the first, second, third and fourth layers are respectively 0.3 μm, 0.6 μm, 0.6 μm, and 1.2 μm, for example. The wiring on the third layer mainly Extend perpendicularly to the wiring on the second layer. The wiring on the fourth layer mainly extend in parallel with the wiring on the third layer. Also, as in the aforesaid embodiment, the wiring layer of the first layer is formed with a high melting metal film such as tungsten, etc., for example, while the wiring layers of the second, third and fourth layers are formed with a metal film having low resistivity than the high melting metal film, such as aluminum alloy film.

Also, though not particularly limited to, the contact holes 200 and through holes 202 are filled with tungsten the same as the aforesaid embodiment.

Thus, as in the aforesaid embodiment, a higher integration can be achieved without increasing the size of the logic cell. At the same time, it is possible to reduce the stage differences in the bases of the upper wiring layers in the multi-layer wiring formation for the improvement of the electrical reliability.

Figure 8B:
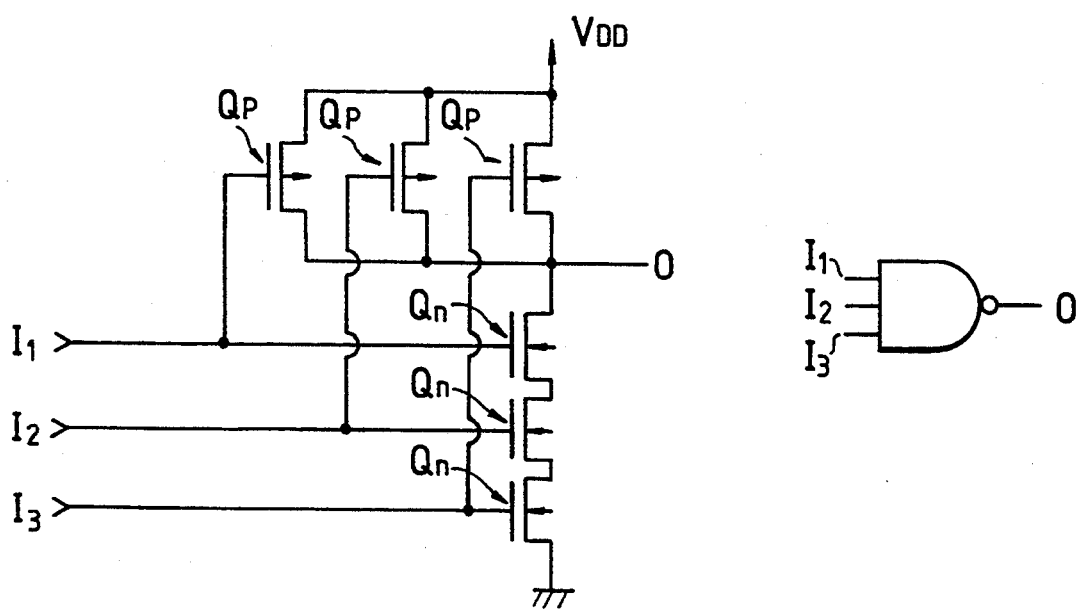
FIG. 8B is a view showing the equivalent circuit of the logic cell shown in FIG. 8A.
Figure 8A:
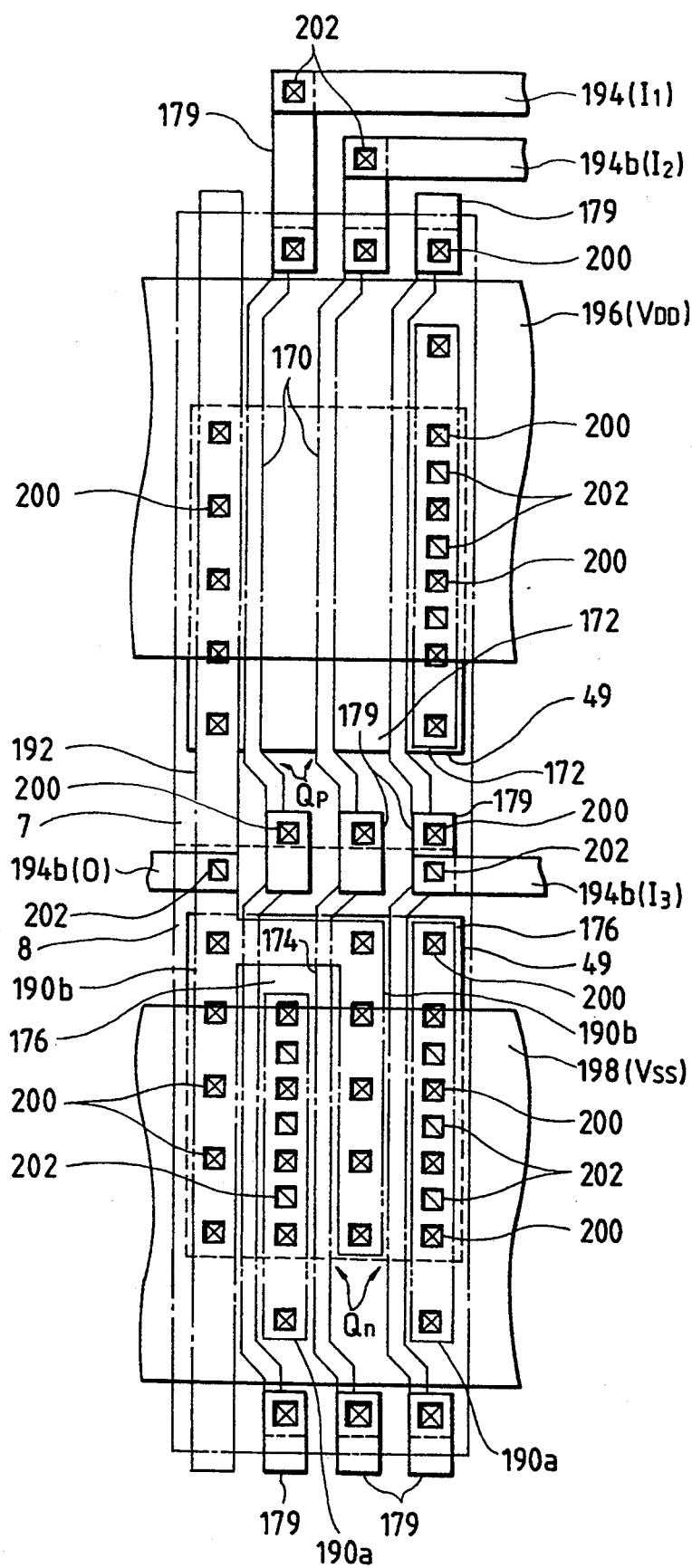
FIG. 8A is a view showing another example of the logic cell of the semiconductor integrated circuit device shown in FIG. 6B.

In this respect, FIG. 8A is a plan view showing a three-input NAND circuit comprising CMOS, which is another example of a logic cell. FIG. 8B is a view showing the equivalent circuit shown in FIG. 8A.

Figure 9:
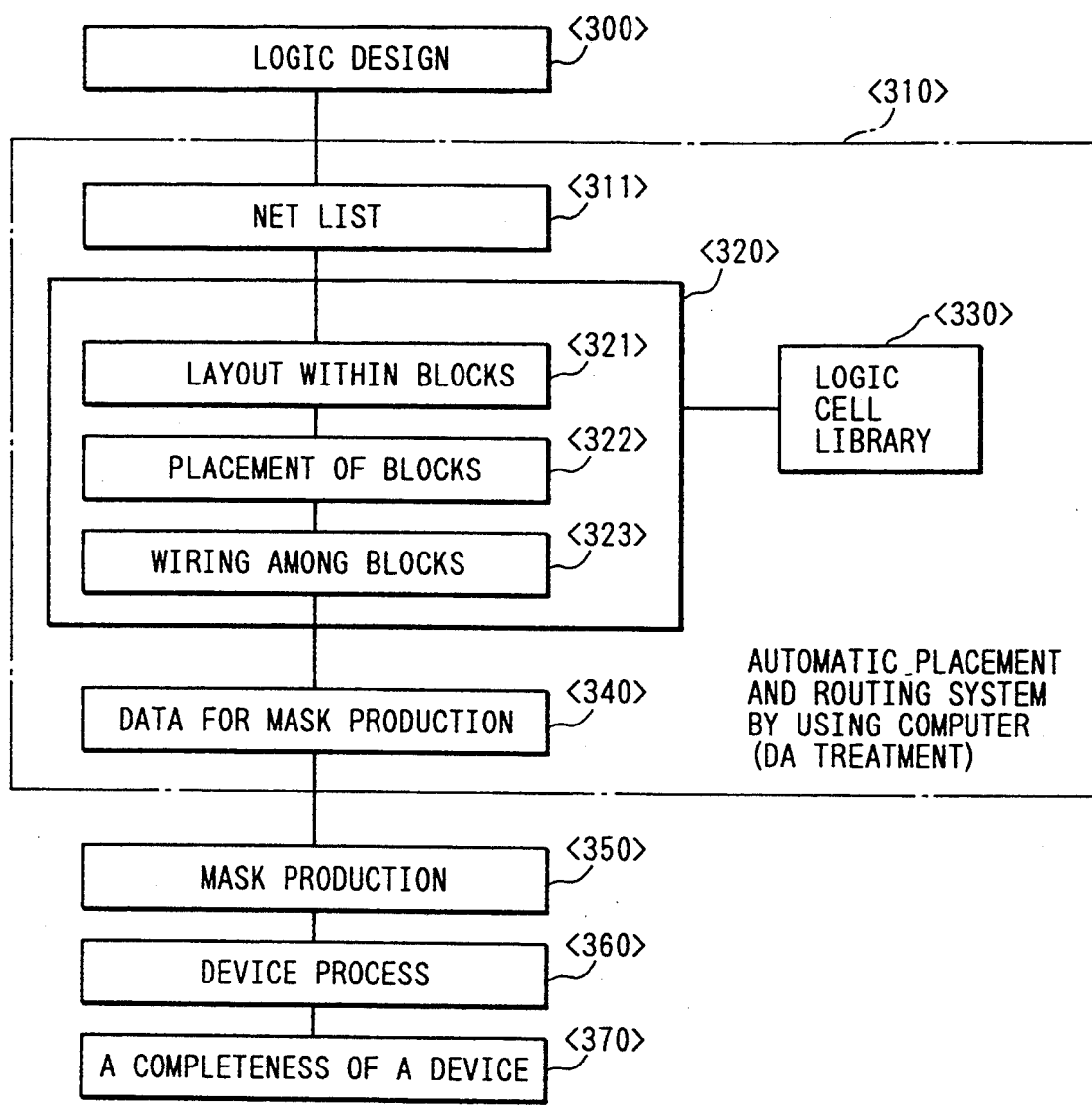
FIG. 9 is a block diagram showing the process flow of the fabrication method of the semiconductor integrated circuit device shown in FIG. 6A.

Hereinafter, a method of fabricating a semiconductor integrated circuit device 100 adopting the aforesaid standard cell system will briefly be described with reference to FIG. 9 (process flowchart).

At first, the logic applicable to the semiconductor integrated circuit device 100 is designed to prepare the logic circuit diagram <300>.

Next, in accordance with the logic circuit diagram, the logic circuits are automatically arranged and connected by an automatic arrangement and wiring system (DA) using a computer <310>. In the automatic arrangement and wiring system, the wiring connection information is initially inputted into the automatic the automatic arrangement and wiring system <31L> as the wiring connection information (NET LIST) acceptable to the automatic arrangement and wiring system in accordance with the logic circuit diagram.

Then, in accordance with the wiring connection information inputted into the automatic arrangement and wiring system, the automatic arrangement and wiring of designed logic circuit are performed <320>.

At this stage of automatic arrangement and wiring <320>, though not particularly limited to, the logic cell library is used to automatically perform the arrangement of wiring in a block <311>, the arrangement of blocks <322>, and the wiring between blocks <323> to prepare the complete logic circuit information.

Subsequently the logic circuit information thus completed by the automatic arrangement and wiring system are converted into the data for mask production in this automatic arrangement and wiring system on the basis of the design rules <340>. The processes from the stage <311>, at which the aforesaid wiring connection information are inputted, to the stage <340>, at which the inputted information are converted into the data for mask production, are automatically performed by the automatic arrangement and wiring system.

Then, in accordance with the data for mask production, the masks for wiring connections (production masks with wiring connection patterns) are manufactured by an electron beam (EB) lithographic system <350>.

Subsequently, using the masks for wiring connections, the device processes are performed <360> to substantially complete the semiconductor integrated circuit device 100 with the specific logics mounted thereon <370>.

The above description has been made mainly of the invention designed by the present inventor in the case where the invention is applied to the gate array system and standard cell system in the field of application which constitutes the background of the invention, but it must be understood that the present invention is not limited to such applications, and that the invention is widely applicable to other semiconductor integrated circuit devices. In other words, the present invention can be applied to semiconductor integrated circuit devices comprising circuit elements including at least MISFET, and multi-layer wiring structure.

The effects obtainable by the typical inventions of those disclosed in the present application will subsequently be described in brief.

(1) In a semiconductor integrated circuit device comprising the cells formed of circuit elements including MISFETS, and a multi-layer wiring structure, contact holes are formed almost in the entire area over the predetermined semiconductor regions (source and drain regions) of the MISFET, and the shunt wiring formed on the wiring layer of the first layer and the predetermined semiconductor regions are connected through the contact holes to widen the contact area of the semiconductor regions of the MISFET and the shunt wiring. Hence the parasitic resistance of the MISFET can be reduced to promote the high-speed operation of the semiconductor integrated circuit device. In this case, it is possible to prevent lowering the integration of the semiconductor integrated circuit device by forming the supply wiring for cells on the wiring layer of the second layer.

(2) In the semiconductor integrated circuit device of the aforesaid (1), it is possible to improve its integration because the increase of the area of the basic cells can be prevented by arranging the through hole for connecting the shunt wiring and the supply wiring for cells immediately above the contact hole.

(3) When the through holes for connecting the shunt wiring with the supply wiring for cells are arranged immediately above the aforesaid contact hole, the surface of the contact hole can be flattened by filling in the aforesaid contact hole with a high melting metal such as tungsten. Hence the through holes can be arranged immediately above the contact holes with ease.

Figure 10:
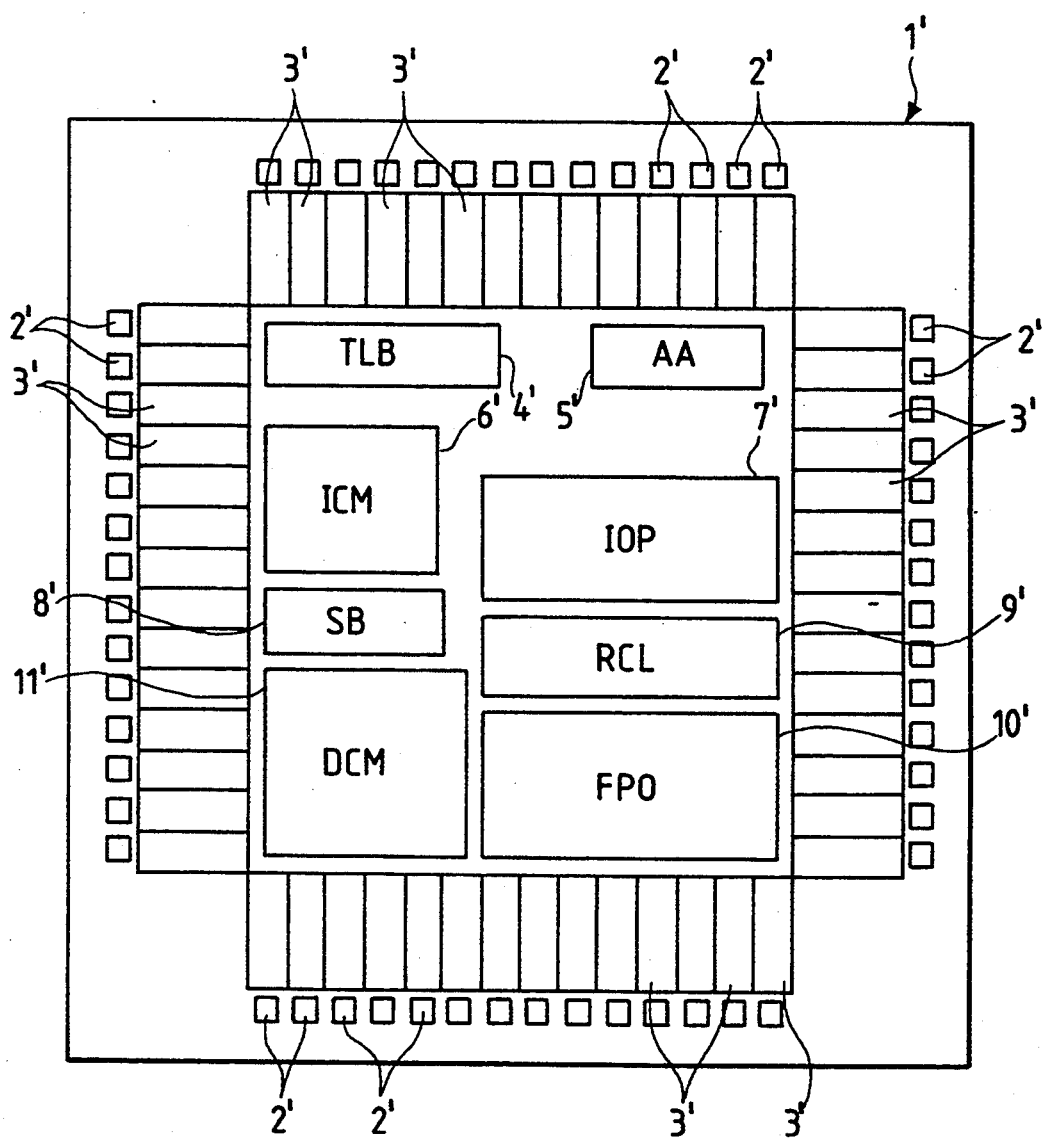
FIG. 10 shows the layout of a semiconductor integrated circuit device using a standard cell system, which is an embodiment Of the present invention.

The configuration of a semiconductor integrated circuit device using a standard cell system, which is an embodiment of another aspect of the present invention is shown by FIG. 10 (layout drawing).

As shown in FIG. 10, a semiconductor integrated circuit device 1' using the standard cell system is composed of a single-crystal silicon substrate whose shape of a plan view is almost square. A plurality of external terminals (bonding pads) 2' are arranged at the peripheral area of the element forming surface along each side of the square semiconductor integrated circuit device 1'.

In the area inside and close to the external terminals 2', input/output buffer circuits 3' are arranged on the element forming surface of the semiconductor integrated circuit device 1'. The input/output buffer circuits 3' correspond to the external terminals 2' (e.g., one-to-one correspondence). Though the configuration of the input/output buffer circuit 3' is not shown in detail, it comprises an input buffer circuit cell and output buffer circuit cell. The input buffer circuit cell comprises, for example, complementary MISFETs (Metal Insulator Semiconductor Field Effect Transistors) constituting a first-stage input circuit, a resistive element constituting an electrostatic breakdown preventive circuit, and an MISFET for clamping. The output buffer circuit cell comprises, for example, complementary MISFETs and a bipolar transistor constituting a final-stage output circuit. The input/output buffer circuit 3' can constitute either input buffer circuit or output buffer circuit by selectively interconnecting semiconductor elements in the input buffer circuit cell or those in the output buffer circuit cell.

In the cell area enclosed by the input/output buffer circuit 3', a plurality of macro-cells (also called a logic circuit block or functional circuit block) 4' through 11' are arranged in the center of the element forming surface of the semiconductor integrated circuit device 1'. In FIG. 10, the macro-cell 4' is a translation look-aside buffer circuit (TLB), the macro-cell 5' is an address array circuit (AA), the macro-cell 6' is an instruction cache memory circuit (ICM), the macro-cell 7' is an integer operation circuit (IOP), the macro-cell 8' is a store buffer circuit (SB), the macro-cell 9' is a random control logic circuit (RCL), the macro-cell 10' is a floating-point operation circuit (FPO), and the macro-cell 11' is a data cache memory circuit (DCM).

These macro-cells 4' through 11' are configured by combining a plurality of basic cells each being a minimum-unit basic circuit pattern repetitively used. The basic cells can constitute a basic circuit for constructing any one of the macro-cells 4' through 11', that is, a logic circuit such as an OR circuit, AND circuit, NAND circuit, or EOR circuit and a functional circuit such as a flip-flop circuit, adder, or delay latch circuit.

The semiconductor integrated circuit device 1' of this embodiment using the standard cell system is configured by a so-called SOG (Sea of Gates) system in which basic cells are regularly arranged like E matrix in almost the entire cell area. In the SOG system, the area of basic cells provided with no basic circuit is basically used as a wiring channel area for interconnecting basic cells in the macro-cell and also, the area where no macro-cell is arranged is used as a wiring channel area for interconnecting macro-cells in the cell area. Among the macro-cells 4' through 11' mounted on the semiconductor integrated circuit device 1' using a standard cell system shown in FIG. 10; the macro-cell (integer operation circuit) 7', the macro-cell (store buffer circuit) 8', and the macro-cell (floating-point operation circuit) 10' execute high-speed circuit operations and are designed differently from other macro-cells 4', 5', 6', 9', and 11'.

Figure 12:
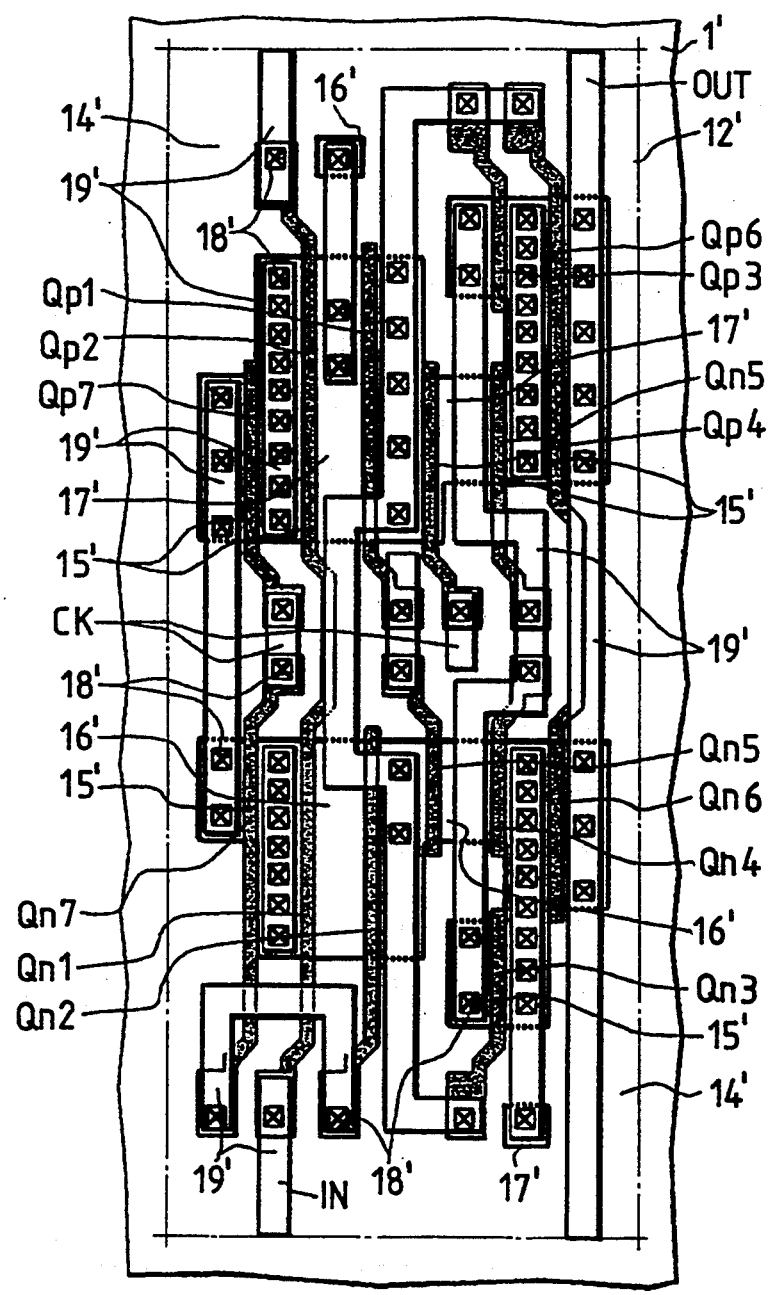
FIG. 12 shows a plan view of an essential portion of a basic cell.

The following is the brief description of the configuration of the basic cells used for the macro-cells 7', 8', and 10' capable of executing high-speed circuit operations in the semiconductor integrated circuit device 1' using the standard cell system by referring to FIG. 12 (a plan view of the essential portion).

The basic cell 12' shown in FIG. 12 consists of seven complementary MISFETS, though the number of MISFETs is not limited to 7'. One complementary MISFET consists of one p-channel MISFET and one n-charnel MISFET. The basic cell 12' is defined as an area, though this area does not actually exist, enclosed by one-dot chain lines, and numeral 12' is given to the area in FIG. 12 for convenience. (The same is true for the basic cell 13' to be mentioned later.)

The p-channel MISFETs Qp of the complementary MISFETs of the basic cell 12' are formed on the main surface of the n-type well region formed on the main surface of the p-type single-crystal silicon substrate in the area whose circumference is defined by an element isolation insulating film 14'. Each p-channel MISFET Qp is mainly composed of the n-type well region of a channel forming area, gate insulating film, and gate electrode 15' and a pair of p-type semiconductor regions 17' which are the source and drain regions.

A plurality of p-channel MISFETs Qp in the basic cell 12' are arranged in the direction (first direction) of the gate length of each MISFET QP and most MISFETs Qp (six out of seven) are aligned in a line in the direction of the gate length. Two p-channel MISFETs Qp adjacent to each other in the longitudinal direction of the gates among the above p-channel MISFETs Qp constitute integrally the p-type semiconductor area 17' of the other side (electrically interconnected) and shared.

The n-channel MISFETs Qn of the complementary MISFETs of the basic cell 12' are formed on the main surface of the p-type well area formed on the m&in surface of the p-type single-crystal silicon substrate in the area whose circumference is defined by an element isolation insulating film 14'. Each n-channel MISFET Qn is mainly composed of the p-type well area of a channel forming area, gate insulating film, and gate electrode 15' and a pair of n-type semiconductor region 16' which are the source and drain regions.

A plurality of n-channel MISFETs Qn in the basic cell 12' are arranged in the direction of the gate length of each MISFET Qn similarly to the arrangement of a plurality of p-channel MISFETs Qp and most n-channel MISFETs Qn (six out of seven) are generally arranged in a straight line the direction of the gate length. Two n-channel MISFETs Qn adjacent to each other in the direction of the gate length among the above n-channel MISFETs Qn constitute integrally the n-type semiconductor region 16' of the other side (electrically interconnected) and shared. In the basic cell 12' the n-channel MISFETs Qn are generally arranged in a line in the direction (second direction) of the gate width of the p-channel MISFETs Qp.

The gate insulating film of each p-channel MISFET Qp and n-channel MISFET Qn in the basic cell 12' consists of, for example, a silicon oxide film.

Each gate electrode 15' consists of a multilayered film made by forming a silicified refractory metal film (in this embodiment, $WSi_2$ film is used) on a polycrystalline silicon film though the structure of the gate electrodes 15' is not limited to this one. The gate electrode 15' is formed in the first-layer gate material forming process of the manufacturing processes of the semiconductor integrated circuit device 1' using the standard cell system with the gate length being of 0.5 $\mu$m though not restricted to this value.

Each of the gate electrodes 15' of the p-channel MISFETs Qp and the n-channel MISFETs Qn is extended to the element isolation insulating film 14' in the direction of the gate width to constitute a terminal. The terminal constitutes the area (equivalent to the terminal of the basic cell 12') for connection with the signal wiring (19') of the upper layer. The terminal of each gate electrode 15' is extended in the direction of the gate length from the place where the gate electrode 15' is formed to the place where the gate electrode 15' can be connected with either of the p-type semiconductor region 17' and n-type semiconductor region 16' by a straight line extending in the second direction. That is, the terminals of the gate electrodes 15' are arranged at arrangement intervals approximately equal to the arrangement intervals (pitch between gate electrodes) in the gate length direction of each gate electrode 15' of a plurality of p-channel MISFETs Qp and a plurality of n-channel MISFETs Qn and formed in positions shifted in the longitudinal direction of the gate by the distance equivalent to $\frac{1}{2}$ the arrangement intervals of the gate electrodes 15'.

Each of the p-channel MISFETs Qp and n-channel MISFETs Qn has an LDD (Lightly Doped Drain) structure, though the structure is not limited to this one. The 25 p-channel MISFETs Qp and n-channel MISFETs Qn using the LDD structure have a high hot-carrier breakdown voltage and a feature that the short channel effect can be weakened.

Figure 11:
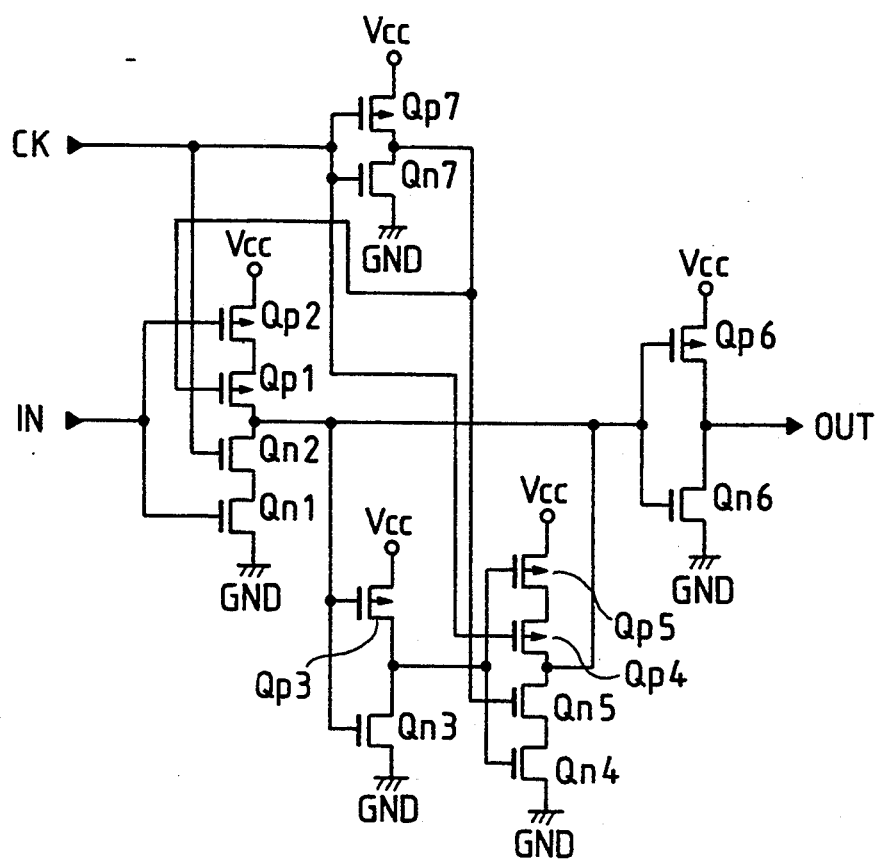
FIG. 11 shows a basic circuit diagram of a macro-cell.

To the basic cell 12' thus configured, a delay latch circuit which is one of the basic circuits constituting any one of the macro-cells 7', 8', and 10' as shown in FIG. 11 (delay latch circuit diagram). The delay latch circuit shown in FIG. 11 consists of seven p-channel MISFETs Qp1 through Qp7, seven n-channel MISFETs Qn1 through Qn7, i.e., seven pairs of complementary MISFETS. In FIG. 11, symbol CK is a reference clock signal, IN is an input signal, and OUT is an output signal. A supply voltage Vcc is fad to the source region of each p-channel MISFET Qp, using, for example, a circuit operating voltage 5 V or a step-down power supply voltage 3.3 or 3.0 V. A reference voltage GND is fed to the source region of each n-channel MISFET Qn, using, for example, a circuit grounding voltage 0 V.

The basic cell 12' in FIG. 12 is provided with a delay latch circuit in FIG. 11. The semiconductor integrated circuit device 1' of this embodiment using a standard cell system has a four-layer structure. FIG. 12 shows the first-layer wirings, FIG. 13 (plan view of the essential portion) shows the second-layer wirings, and FIG. 14 (plan view of the essential portion) shows the fourth layer wirings.

As shown in FIG. 12, the complementary MISFETs in the basic cell 12' are basically interconnected by the first-layer signal wiring 19' (wiring in basic cell). The first-layer signal wiring 19' is provided over the complementary MISFET (accurately, the gate electrode 15' and emitter lead-out electrode 34' which will be mentioned later) through a inter-layer insulating film. The first-layer signal wiring 19' is connected to one of the terminal of the gate electrode 11', p-type semiconductor region 17' of the p-channel MISFET Qp, and n-type semiconductor region 16' of the n-channel MISFET Qn through a contact hole 18 formed in the inter-layer insulating film.

The first-layer signal wiring 19' can be extended in the first and second directions in the basic cell 12'. Most of the first-layer signal wiring pass over the terminal of the gate electrode 15', p-type semiconductor region 17', and n-type semiconductor region 16' and connected to one of them in a predetermined position.

The first-layer signal wiring 19' is formed in the first-layer signal wiring forming process of the manufacturing processes by using a refractory metal film whose resistance value is by approx. one order of magnitude larger than those of aluminum and aluminumalloy films but whose allowable current density is 3 to 4 times larger than those of them, in order to improve, for example, the electromigration resistance (EMD) and the stress migration resistance (SMD) and realize fine wiring. The refractory metal film has a double-structure W film formed by depositing a W film through a sputtering method for improving the adhesion with the lower layer on a W film deposited through a CVD method for improving the step coverage at the substrate level step of the contact hole 18'. The first-layer signal wiring 19' of the above W film has a film thickness of, for example, 0.3 to 0.5$\mu$ and the wiring width is approx. 1.0 $\mu$m.

In the basic cell 12', the p-type semiconductor regions 17' serving as the source regions of the p-channel MISFETs Qp are electrically interconnected with the first-layer shunting wiring 19' formed in the same wiring layer of the first-layer signal wiring 19' through the contact holes 18' arranged in the second direction (the direction of the gate width). Similarly, the n-type semiconductor regions 16' serving as the source regions of the n-channel MISFETs Qn to which the reference voltage GND is fed are interconnected through the through-holes 18' to a plurality of first-layer shunting wirings 19'. These first-layer shunting wiring 19' can decrease the resistance values of the p-type semiconductor region 17' and the n-type semiconductor regions 16'. Because the first-layer shunting wiring 19' and the first-layer signal wiring 19' have a function as a barrier metal film, they can decrease alloy spikes due to mutual diffusion between Al of the second-layer wiring (21), which will be mentioned later, and Si of either p-type semiconductor region 17' or n-type semiconductor region 16'.

The first-layer signal wiring 19' used for interconnecting the complementary MISFETs in the basic cell 12' is also used as the first-layer signal wiring 19' for interconnecting basic cells 12' (or basic circuits formed of the basic cells 12') adjacent to each other in the second direction (the direction of the gate length). The first-layer signal wiring 19' is separately formed in a wiring layer different from that of the second-layer power supply voltage wiring (Vcc) 21' and second-layer reference-voltage wiring (GND) 21' both passing over the basic cells 12' and used for directly feeding power to the basic cell 12', as will be described later (when the wiring 19' is extended in the second direction, this wiring is not limited in the arrangement place and extending direction). That is, the first-layer signal wiring 19' for interconnecting basic cells 12' is integrally connected with the first-layer signal wiring 19' for interconnecting the complementary MISFETs in the basic cells 12' (basic cells 12' can be interconnected by extending the wiring from the basic cells 12' in the second direction). Therefore, for interconnecting the basic cells 12' adjacent to each other in the second direction, no wiring channel areas for forming other wirings, e.g., the second-layer wirings and for performing the connection with the second-layer wirings.

The first-layer signal wiring 19' and the first layer shunting wiring 19' can be formed not only of the W film but of one of a refractory metal film such as an Mo film, silicified refractory metal film such as a $WSi_2$ or $MoSi_2$ film, and a multilayered film made by forming a refractory metal film or silicified refractory metal film on a polycrystalline silicon film.

Figure 13:
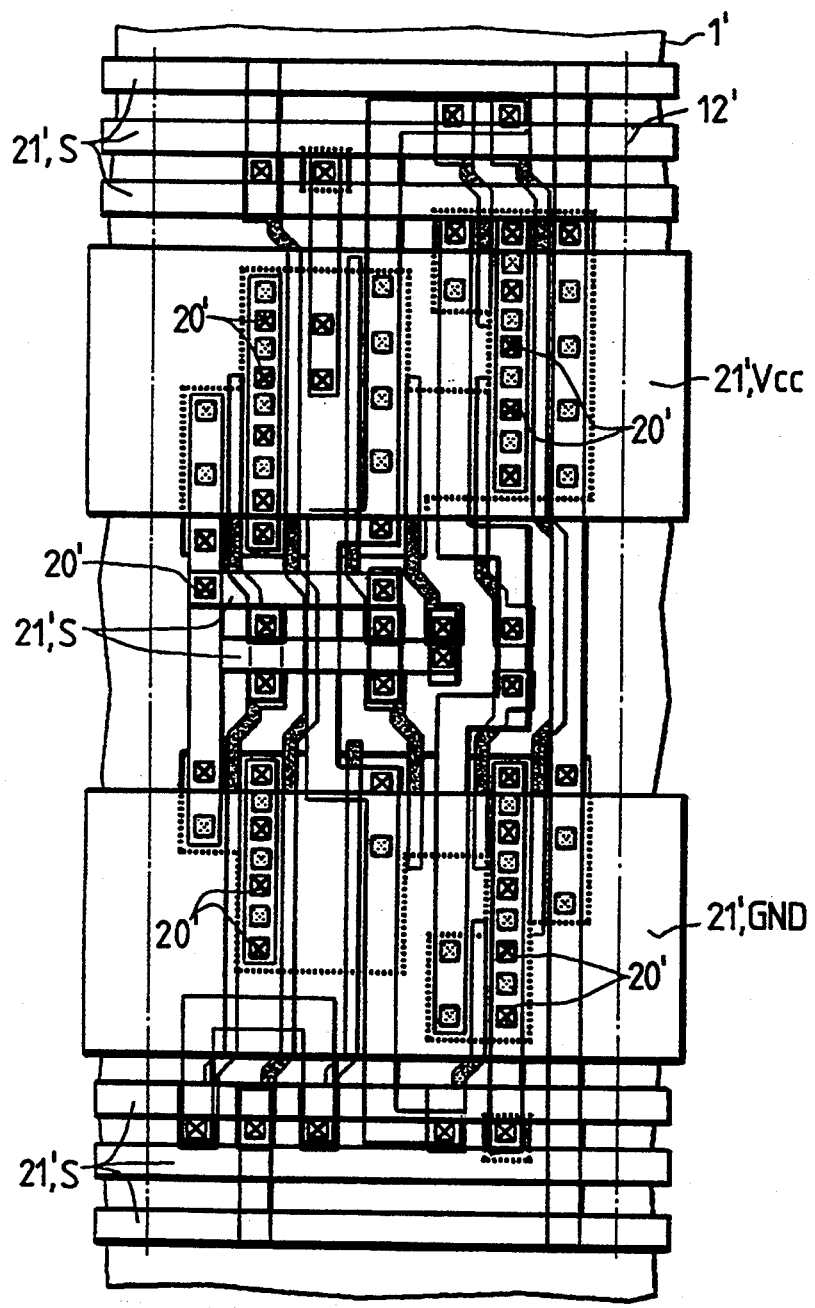
FIG. 13 shows a plan view of an essential portion of the basic cell.

As shown in FIG. 13, the second-layer signal wiring (S) 21', second-layer power supply wiring (Vcc), and second-layer reference-voltage wiring (GND) are arranged over the first-layer signal wiring 19' on the basic cell 12'. These second-layer wirings are arranged over the first-layer signal wiring 19' through an interlayer insulating film and electrically interconnected through a contact hole 20' formed in the interlayer insulating film. The second-layer wirings are basically used as wirings extending in the first direction (the direction of the gate length).

The second-layer power supply voltage wiring 21' extends over a plurality of p-channel MISFETs Qp in the basic cell 12' in the arrangement direction (first direction) of these p-channel MISFETs Qp. The second-layer power supply voltage wiring 21' has a width equal or close to the gate width of the p-channel MISFETs Qp having a large driving capacity (having a large size) in order to mainly decrease its resistance. In other words, the second-layer power supply voltage wiring 21', formed between terminals extended to one end and the other of the gate electrode 15' of the p-channel MISFET Qp, has an allowable maximum width.

Similarly, the second-layer reference-voltage wire 21' extends in the first direction over a plurality of n-channel MISFETs Qn in the basic cell 12' and has a wire width equal or close to the gate width of the n-channel MISFET Qn having a large driving capacity.

The second-layer signal wiring 21' is laid between the second-layer power supply voltage wiring 21' and second-layer reference-voltage wiring 21' (corresponding to the inside between the p-channel MISFET Qp and n-channel MISFET Qn), the outside of the second-layer power supply voltage wiring 21' (upper side in FIG. 13), and outside of the second-layer reference-voltage wiring 21' (lower side in FIG. 13). The second-layer signal wiring 21' is used for connection between basic cells 12' adjacent to each other in the first direction (direction of gate length) or between basic circuits formed of the basic cells 12' (the basic circuits are also macro-cells smaller than the macro-cells 4' through 11' described before).

The second-layer wiring 21' is formed in the second-layer wiring forming process of the manufacturing processes, which is a three-layer film composed of, for example, a TiW film, an aluminum alloy film, and a TiW film formed successively. The TiW film of the bottom layer functions as a barrier metal film, which is effective for both EMD and SMD. The TiW film on the top layer can prevent the production of aluminum hillocks and the reflection on the surface of the aluminum alloy film (reduct-on of diffraction in exposure for forming a mask through photolithography). The aluminum alloy film is used for the effective wiring base, which is made of aluminum containing at least either of Cu capable of improving EMD and SMD and Si capable of decreasing alloy spikes. The second-layer wiring 21' has a relatively small film thickness of 0.5 to 0.7 μm in order to flatten the surface of the interlayer insulating film which is the underlayer of the upper wirings. The second-layer power supply voltage wiring 21' and second-layer reference-voltage wiring 21' have wiring widths of, for example, 8.5 to 9.0 μm and the second-layer signal wiring 21' has a wiring width of, for example, approx. 1.0 μm.

When the second-layer power supply voltage wiring 21' is connected to the p-type semiconductor region 17' corresponding to the source region of the p-channel MISFET Qp of the basic cells 12', the first-layer shunting wiring 19' is interposed Similarly, when the second-layer reference-voltage wiring 21' is connected to the n-type semiconductor region 16' corresponding to the source region of the n-channel MISFET Qn, the first-layer shunting wiring 19' is interposed. The first-layer stunting wiring 19' basically functions as a barrier metal film between the second-layer power supply voltage wiring 21' and p-type semiconductor region 17' and between the second-layer reference-voltage wiring 21' and n-type semiconductor region 16'.

For the second-layer wiring 21', it is possible to use TiN films instead of the TiW film on the top and bottom layers and an aluminum film instead of the aluminum alloy film in the middle layer.

Figure 14:
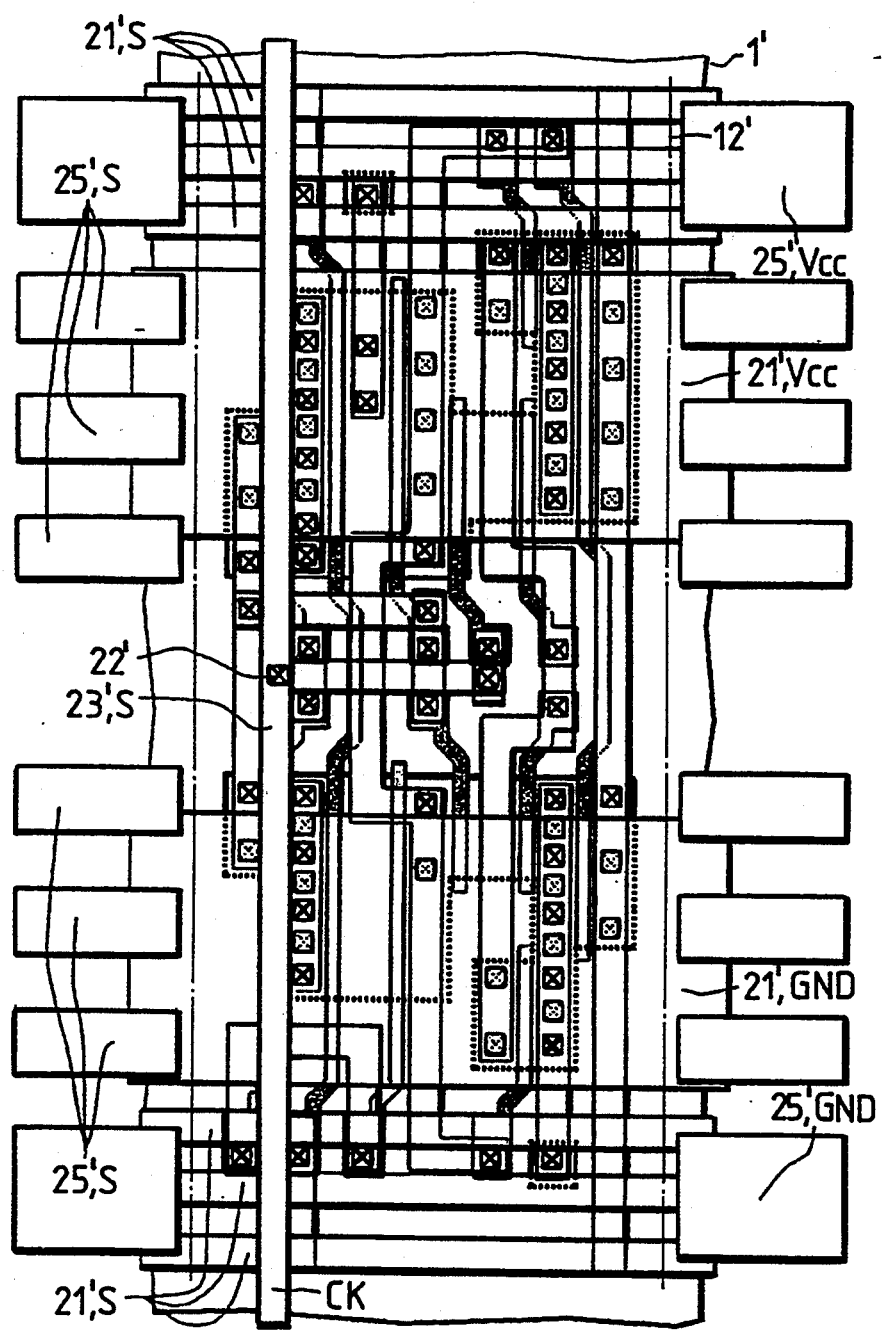
FIG. 14 shows a plan view of an essential portion of the basic cell.
Figure 21:
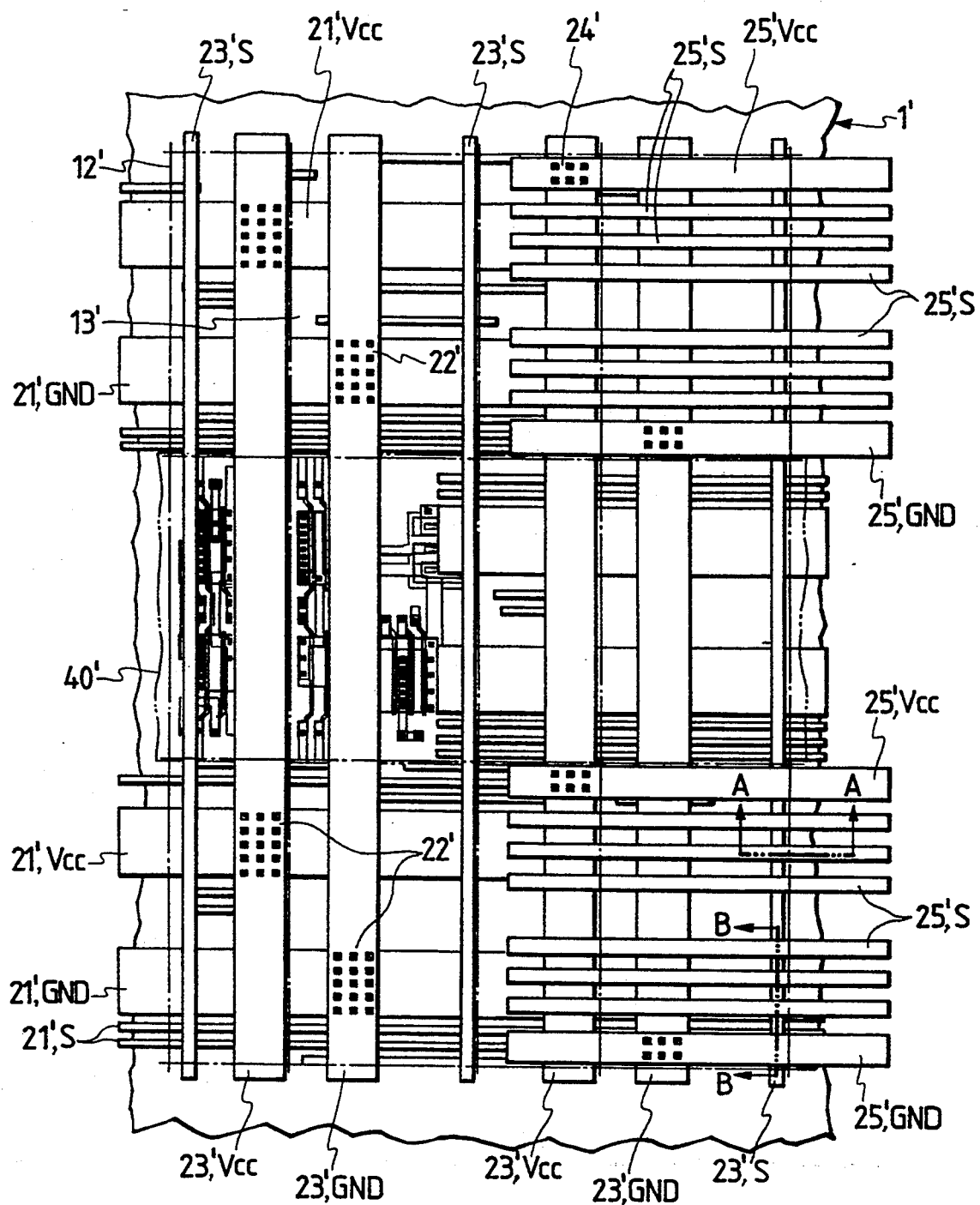
FIG. 21 shows a plan view of an essential portion of the macro-cell.

The third-layer signal wiring (S) 23' shown in FIG. 14 and the third-layer power supply voltage wiring (Vcc) and third-layer reference-voltage wiring (GND) shown in FIG. 21 (plan view of the essential portion) are arranged over the second-layer wiring 21' on the basic cell 12'. These third-layer wirings are arranged over the second-layer wire 21' by interposing an interlayer insulating film and electrically connected to the second-layer wiring through the contact hole 22' formed in the interlayer insulating film. The third-layer wirings are basically used as wirings to be extended in the second direction (the direction of gate width).

The third-layer signal wiring 23' is used for connection between basic cells 12' arranged in the second direction or between basic circuits, formed of the basic cells 12'. The third-layer signal wiring 23' is also used for interconnection of macro-cells 4' through 11' in the first direction.

Figure 23A:
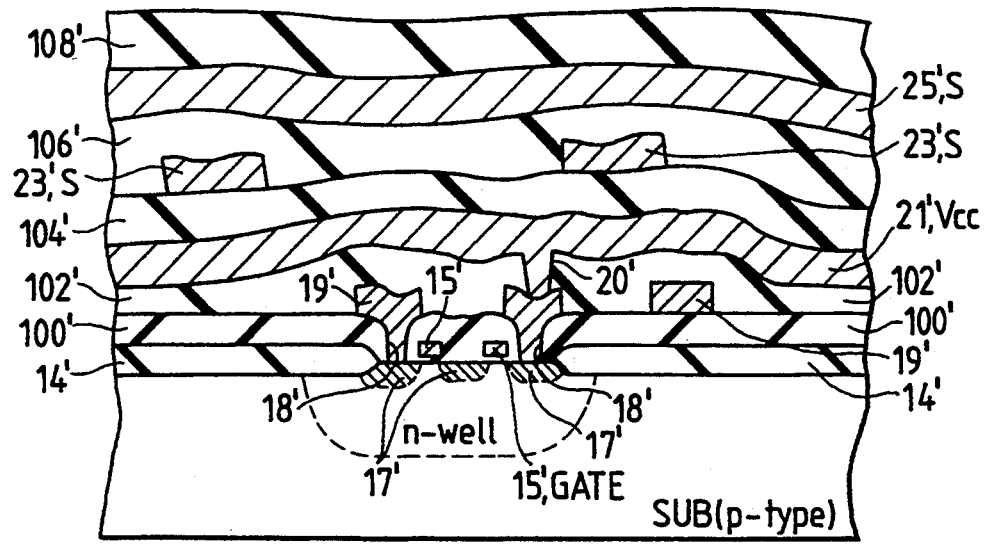
FIG. 23A shows a sectional view of the macro-cell, taken along the line A—A in FIG. 21.
Figure 23B:
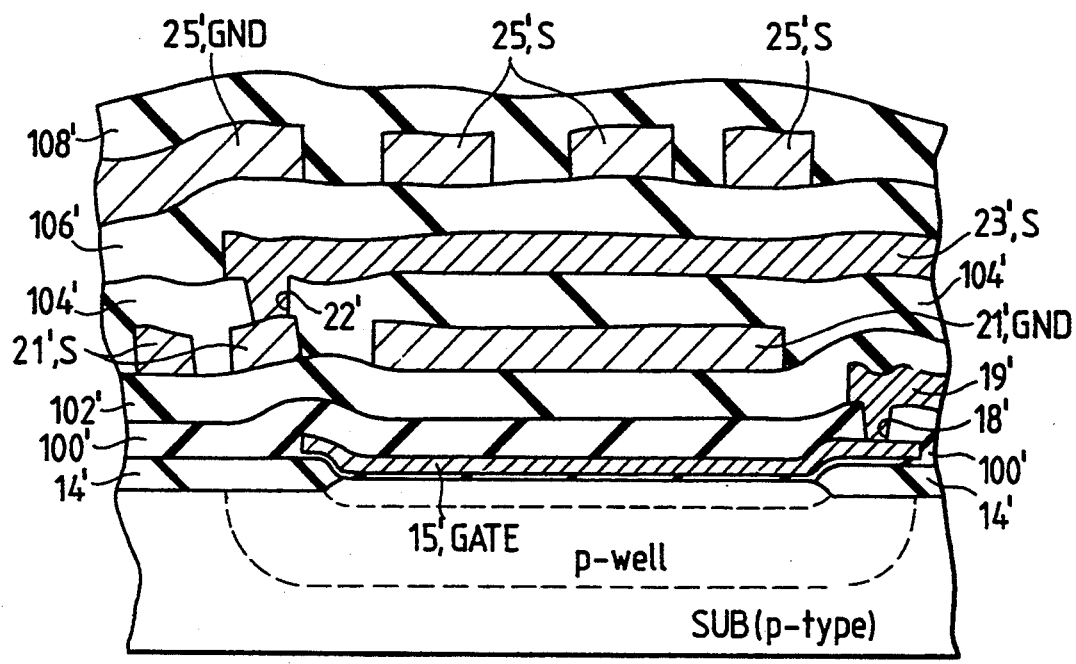
FIG. 23B shows a sectional view of the macro-cell, taken along the line B—B in FIG. 21.

As shown in FIGS. 23A and 23B, the third-layer power supply voltage wiring 23' and third-layer reference-voltage wiring 23' are separated from each other by a predetermined distance and extended in the second direction in approximately parallel. The third-layer power supply voltage wiring 23' is formed to connect the second-layer power supply voltage wiring 21' in the bottom layer with the fourth-layer power supply voltage wiring (Vcc) 25' in the top layer. Similarly, the third-layer reference-voltage wiring 23' is formed to connect the second-layer reference voltage wiring 21' in the bottom layer with the fourth-layer reference-voltage wiring (GND) 25' in the top layer.

The third-layer wiring 23' is formed in the third-layer wiring forming process of the manufacturing processes and has the same structure as that of the second-layer wiring. The third-layer wiring 23' has a relatively small film thickness of 0.5 to 0.7 μm. The third layer power supply voltage wiring 23' and third-layer reference-voltage wiring 23' have wiring widths of, for example, 8.5 to 9.0 μm and the third-layer signal wiring 21' has a wiring width of, for example, approx. 1.0 μm.

As shown in FIGS. 14, 21, 23A, and 23B; the fourth-layer signal wiring (S) 25', fourth-layer power supply voltage wiring 25', and fourth-layer reference voltage wiring 25' are arranged over the third-layer wiring 23' on the basic cell 12'. The fourth-layer wirings are arranged over the third-layer wiring 23' by interposing an interlayer insulating film and electrically connected to the third-layer wiring through the contact hole 24' formed in the inter-layer insulating film. The fourth-layer wirings are basically used as wirings extending in the first direction (the direction of gate length).

The fourth-layer signal wiring 25' is used for connection between basic cells 12' arranged in the first direction or between basic circuits formed of the basic cells 12' in the macro-cells 4' through 11'. The fourth-layer signal wiring 25' is also used for interconnection of the macro-cells 4' through 11' in the first direction and as a critical pass wiring for a reference clock signal.

The fourth-layer power supply voltage wiring 25' and fourth-layer reference-voltage wiring 25' are separated from each other by a predetermined distance in the second direction and extended in the first direction in approximately parallel. The fourth-layer power supply voltage wiring 25' feeds the power supply voltage to the third-layer power supply voltage wiring 23' in the bottom layer. The fourth-layer reference voltage wiring 25' feeds the reference voltage to the third-layer reference-voltage wiring 23' under the fourth-layer reference-voltage wiring 25'.

The fourth-layer wirings 25' are formed in the fourth-layer wiring forming process of the manufacturing processes, have the same structure as that of the second-layer wirings 23' and third-layer wirings 23' and have relatively large film thicknesses of approx. 1.0 μm. The fourth-layer power supply voltage wiring 25' and fourth-layer reference-voltage wiring 25' have wiring widths of, for example, 4.0 to 4.5 μm and the fourth-layer signal wiring 25' as a wiring width of, for example, 2.0 to 2.5 μm.

The fourth-layer power supply voltage wiring 25' and fourth-layer reference-voltage wiring 25' among these fourth-layer wirings 25' are arranged above the second-layer signal wiring 21' extending in the same direction where the fourth-layer power supply voltage and reference-voltage wirings extend. The fourthlayer signal wiring 25' is provided above the second-layer power supply voltage wiring 21' and second-layer reference-voltage wiring 21' extending in the same direction as that of the fourth-layer signal wiring 25'. That is, the line connecting the arrangement position of the second-layer signal wiring 21' with that of the fourth-layer signal wiring 25' intersects the line connecting the arrangement position of the second-layer power supply voltage wiring 21' and second-layer reference-voltage wiring 21' with that of the fourth-layer power supply voltage wiring 25' and fourth-layer reference-voltage wiring 25'. Therefore, the distance between the arrangement position of the second-layer signal wiring 21' and that of the fourthlayer signal wiring 25' is larger than that in the case in which they are vertically arranged. As a result, it is possible to decrease crosstalk noises (coupling noises) generated between the second-layer signal wirings 21' and between the fourth-layer signal wirings 2.5 μm.

In FIGS. 23A and 23B; numerals 100', 102', 104', 106', and 108' are interlayer insulating films consisting of a single layer of SiO₂, PSG, or BPSG film formed through CVD, or a multilayered film made by forming the above films.

Figure 16:
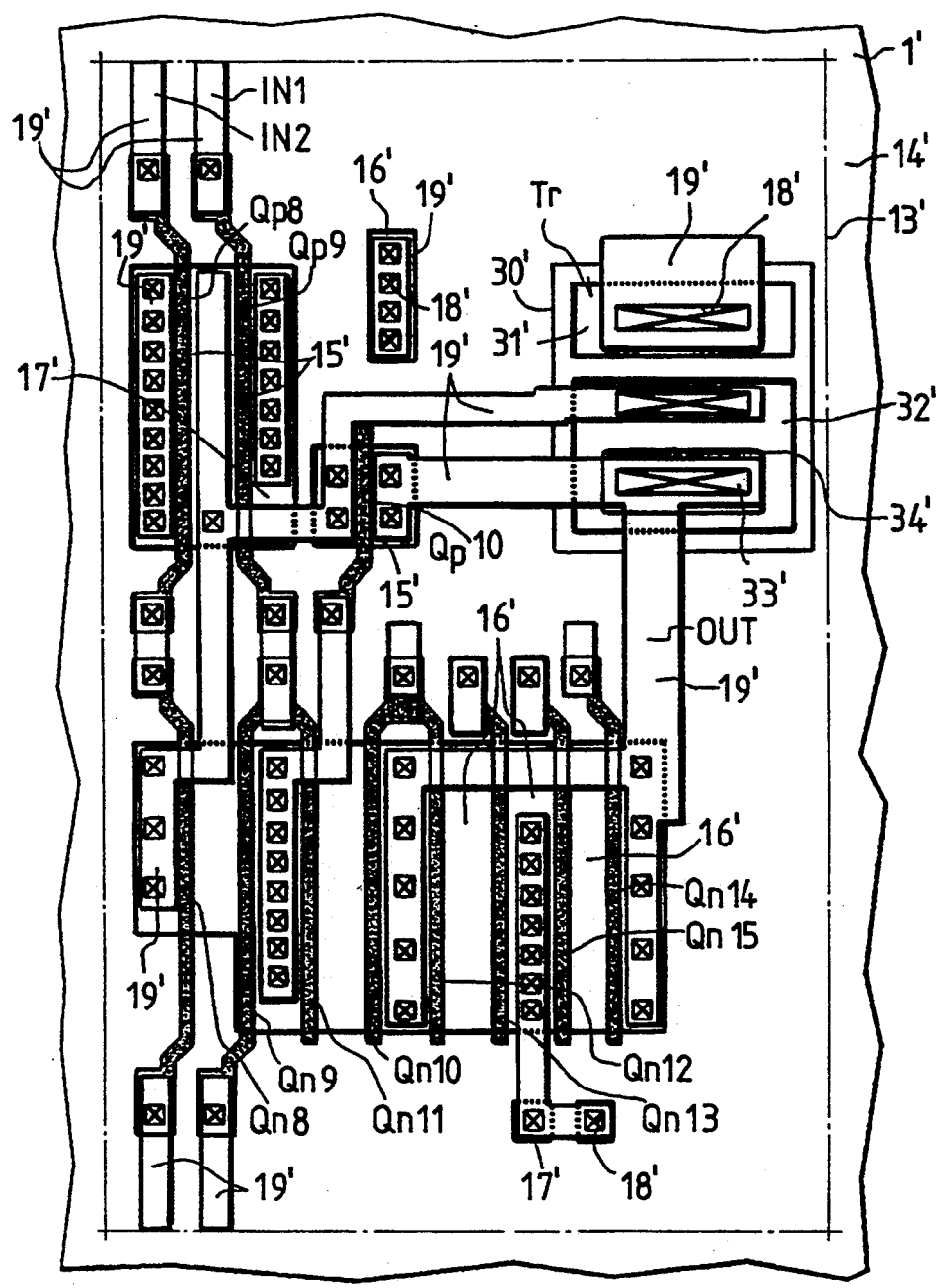
FIG. 16 shows a plan view of an essential portion of a basic cell.

The following is the brief description of the configuration of basic cells other than the basic cell 12' used for macro-cells 7', 8', and 10' in which above-mentioned high-speed operation is executed by referring to FIG. 16 (plan view of the essential portion).

The basic cell 13' shown in FIG. 16 consists of three p-channel MISFETs Qp, eight n-channel MISFETs Qn, and one vertical npn bipolar transistor Tr, though the numbers are not limited to these ones. The structures of the p-channel MISFETs Qp and n-channel MISFETs Qn of the basic cell 13' are basically tie same as those of the p-channel MISFETs Qp and n-channel MISFETs Qn of the above basic cell 12' respectively.

The npn bipolar transistor Tr of the basic cell 13' consists of an n-type collector region, p-type base region, and n-type emitter region. The n-type collector region consists of an n-type well region used for an intrinsic collector region, buried type n-type semiconductor region 30' used for a graft collector area, and n-type semiconductor, region 31' for pulling the collector potential up. The p-type base region consists of a p-type semiconductor region 32' and the n-type emitter region consists of an n-type semiconductor region 33'. The n-type emitter region is connected with an emitter lead-out electrode 34' through an emitter opening not-shown. The emitter lead-out electrode 34' is formed in the second-layer gate forming process of the manufacturing processes, which is made of, for example, a polycrystalline silicon film. The polycrystalline silicon film is doped with an n-type impurity while or after the film is deposited and, thereby, the resistance is decreased and an n-type emitter region is formed.

The element isolation region enclosing the non bipolar transistor Tr mainly consists of a p-type monocrystalline silicon substrate, buried type p-type semiconductor region, p-type well region, and element isolation insulating film 4'.

Figure 15:
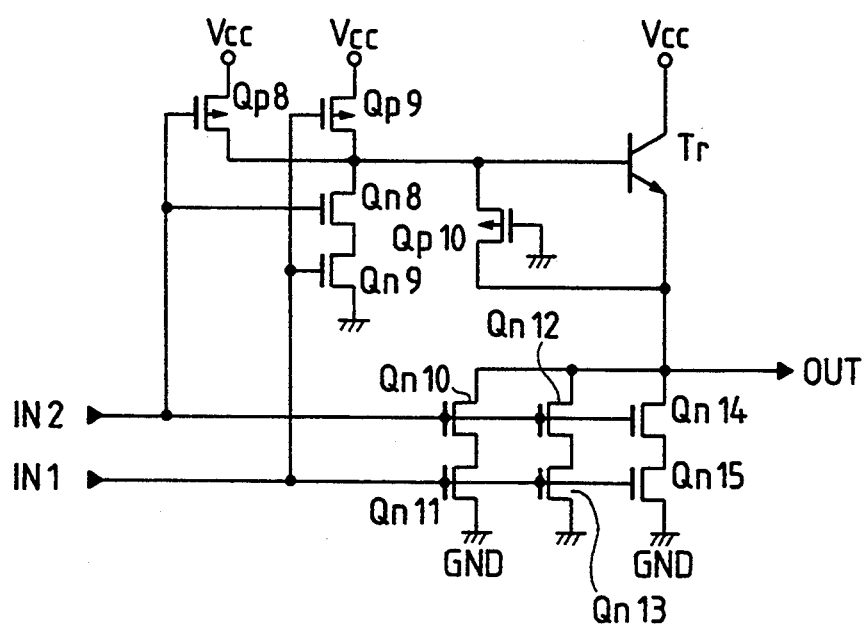
FIG. 15 shows a basic circuit diagram of a macro-cell.

The basic cell 13' thus configured is provided with a two-input NAND gate circuit which is one of the basic circuits constituting the macro-cells 7', 8', and 10' as shown in FIG. 15 (two-input NAND gate circuit diagram). The two-input NAND gate circuit consists of these p-channel MISFETs Qp8 to Qp10, eight n-channel MISFETs Qn8 to Qn15, and one npn-type bipolar transistor Tr. Symbols IN1 and IN2 are input signals and OUT is an output signal.

Figure 17:
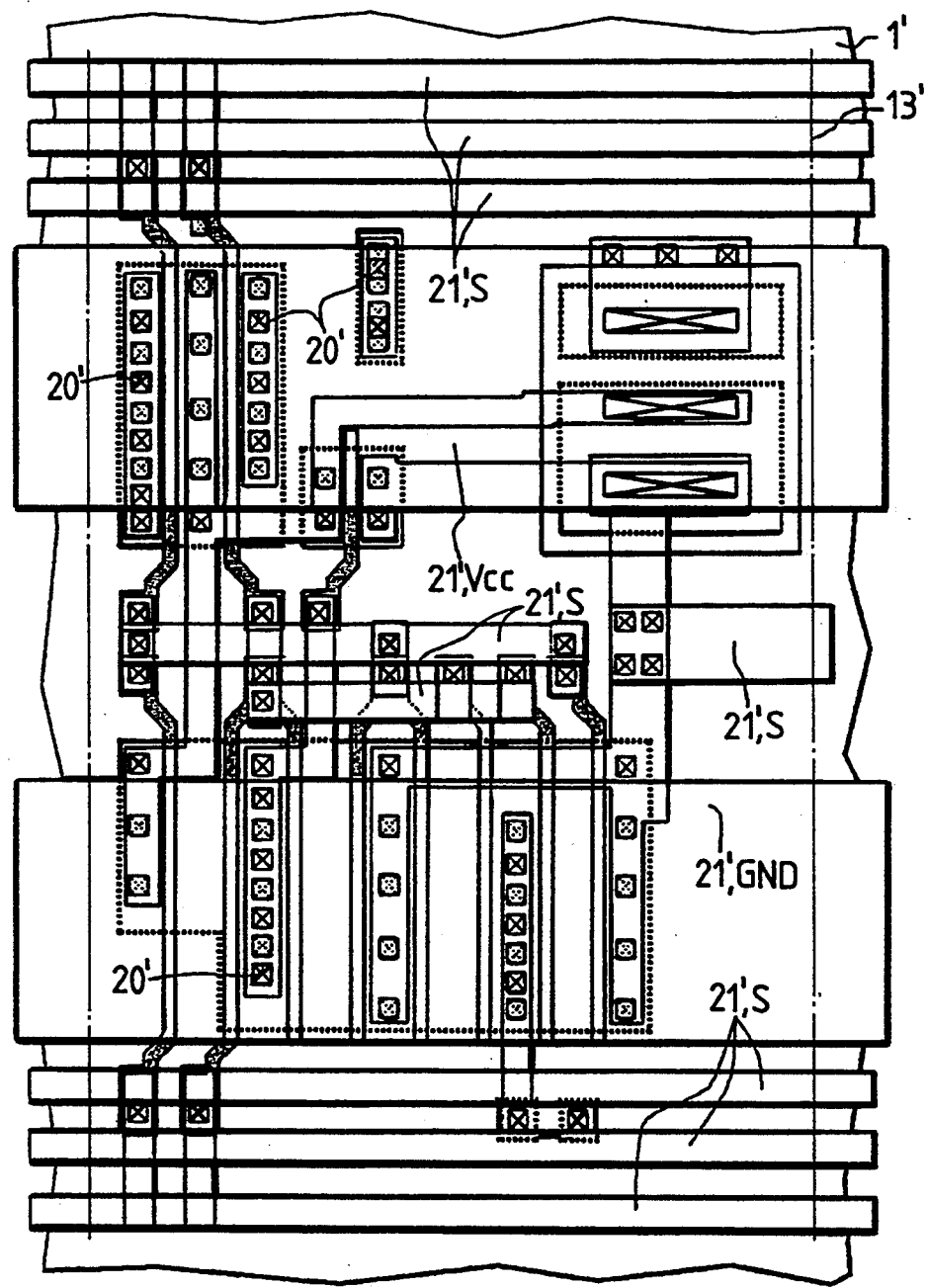
FIG. 17 shows a plan view of an essential portion of the basic cell.
Figure 18:
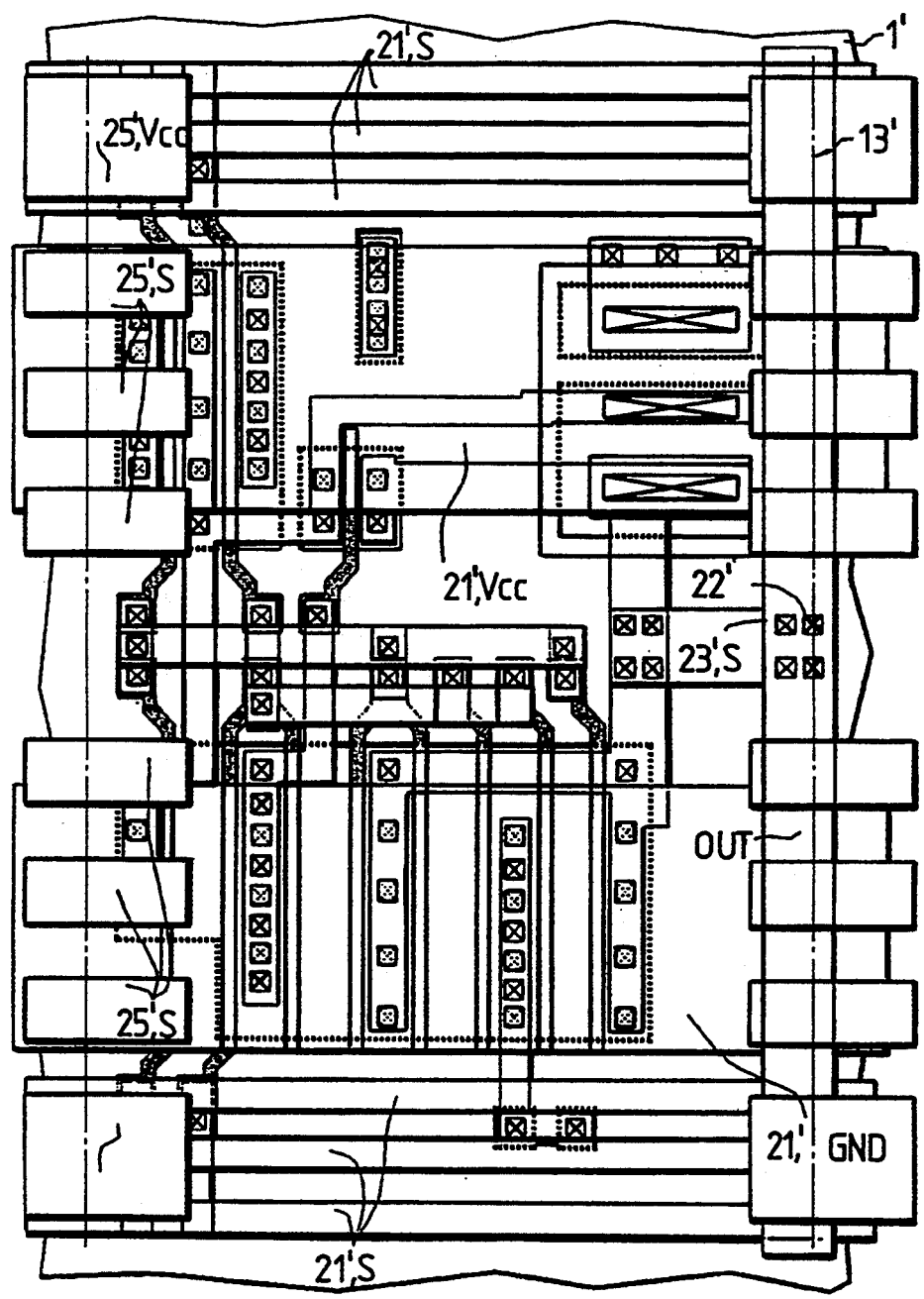
FIG. 18 shows a plan view of an essential portion of the basic cell.

The basic cell 15' in FIG. 16 is provided with the two-input NAND gate in FIG. 15. The p-channel MISFETs Qp, n-channel MISFETs Qn, and npn bipolar transistor Tr which are arranged in the basic cell 13' are basically interconnected by the first-layer wirings 19' shown in FIG. 16, similarly to the basic cell 12' mentioned before. The basic cell 13' receives lower from the second-layer power supply voltage wiring 21' and second-layer reference-voltage wiring 21' shown in FIG. 17 (plan view of the essential portion) and basic cells 13' are basically interconnected by the secondlayer signal wiring 21'. The third-layer wirings 23' and fourth-layer wirings 25' shown in FIG. 18 (plan view of the essential portion) are arranged over the basic cell 13'.

Figure 19:
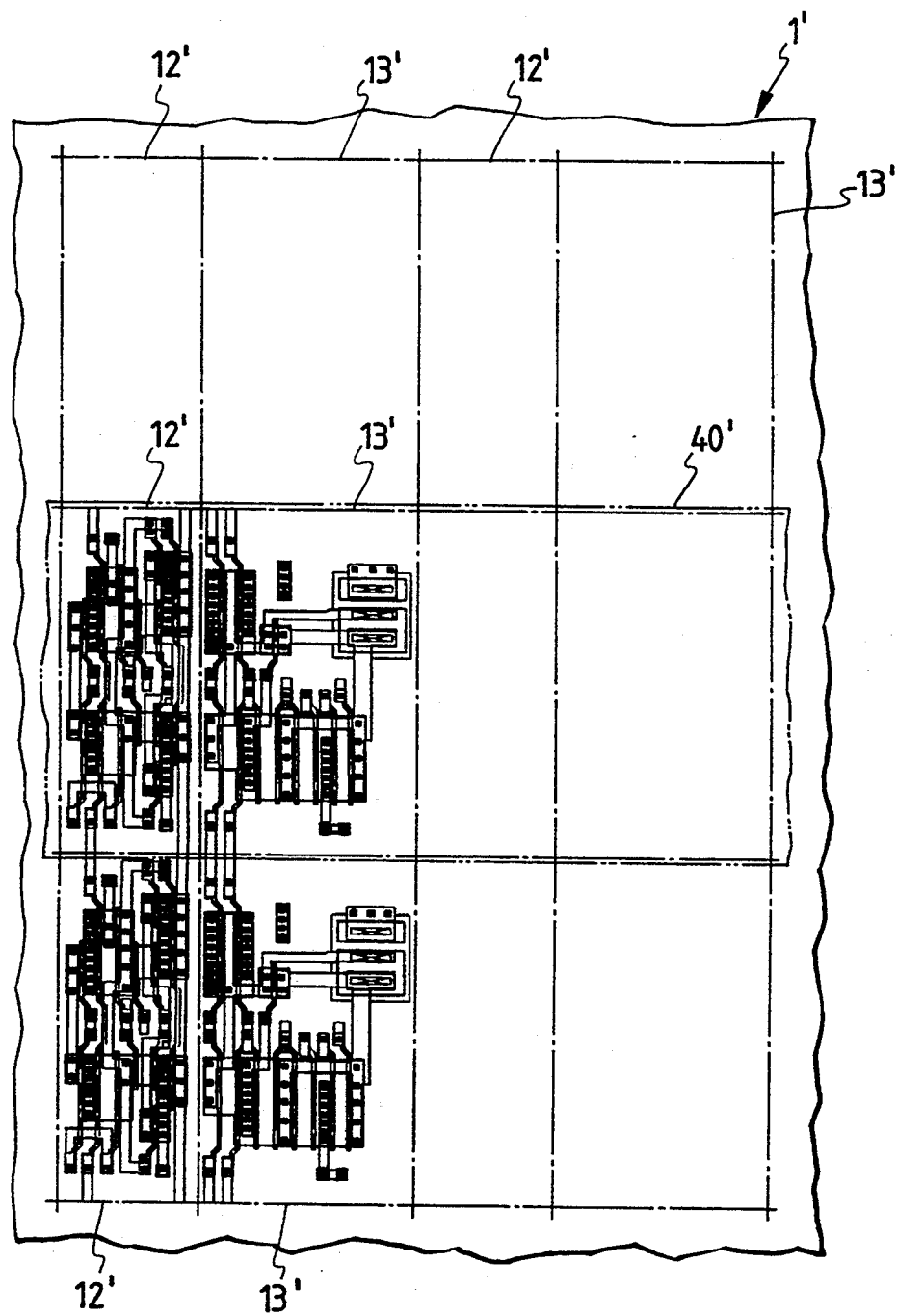
FIG. 19 shows a plan view of an essential portion of a macro-cell.
Figure 20:
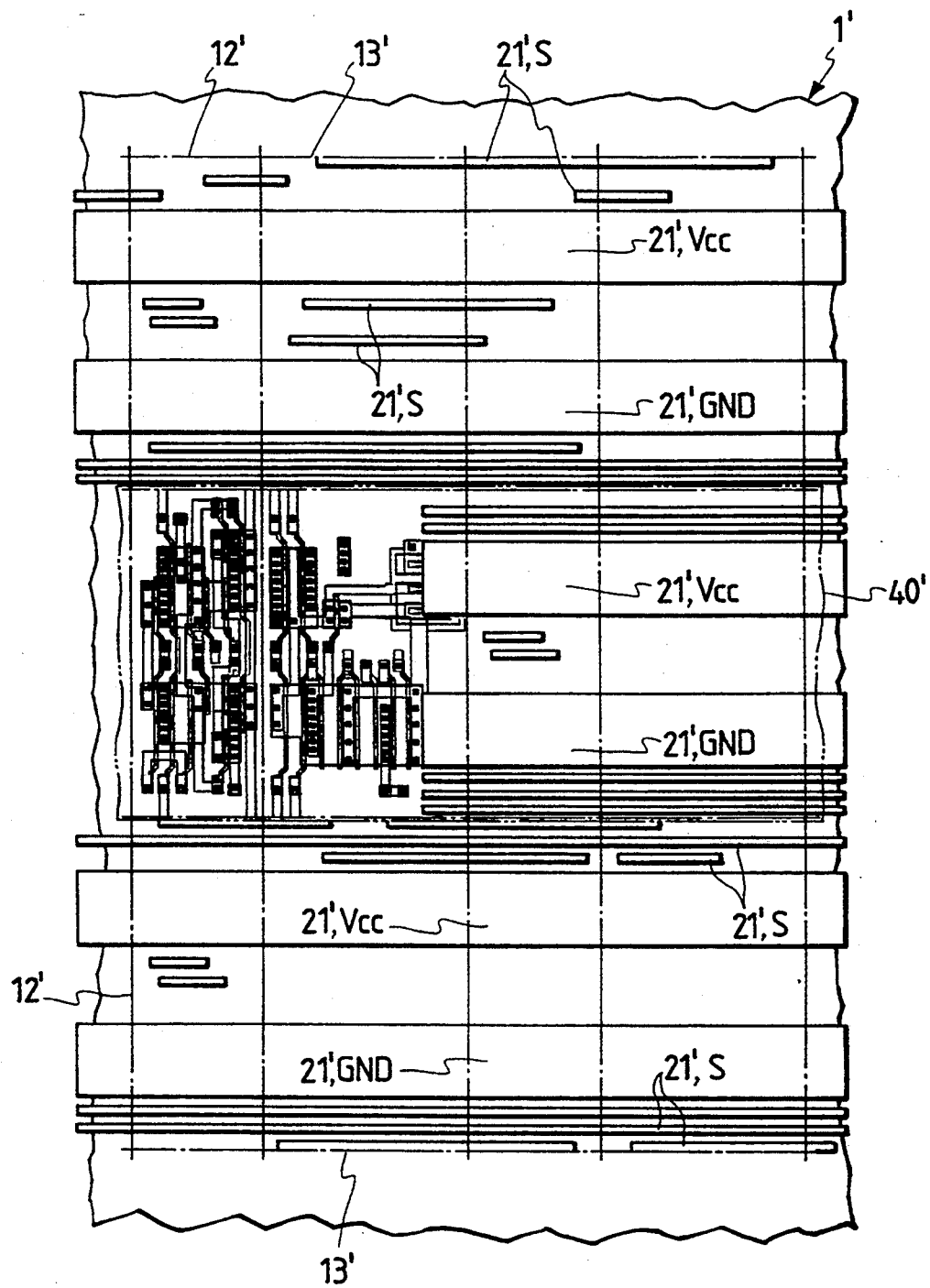
FIG. 20 shows a plan view of an essential portion of the macro-cell.

The basic cells 12' and 13' thus configured are regularly arranged in the first and second directions as shown in FIG. 19 (plan view of the essential portion) to constitute the cell area shown in FIG. 10. FIG. 19 shows the state in which the first-layer wirings 21' are arranged in the basic cells 12' and 13', FIG. 20 (plan view of the essential portion) shows the state in which the second-layer wirings 21' are arranged, and FIG. 21 shows the state in which the third-layer wirings 23' and fourth-layer wirings 25' are arranged. FIG. 23A shows a schematic sectional view of the portion taken along the line A—A in FIG. 21 and FIG. 23B shows a schematic sectional view of the portion taken along the line B—B in FIG. 21.

In the macro-cells 7', 8', and 10' performing high-speed operations in the semiconductor integrated circuit device 1' using the standard cell system basic circuits are basically provided to the basic cells 12' and 13' in the first direction (direction of gate length) to constitute a basic circuit or a macro-cell 40' as shown in FIGS. 19, 20, 21, and 22 (schematic connection diagram). The basic circuit or the macro-cell 40' is formed by interconnecting the basic cells 12' and 13' adjacently arranged in the first direction or arranged relatively closely to each other (or connecting the basic cells 12' to each other or the basic cells 13' to each other) by the second-layer signal wiring 21'.

The basic cells 12' and 13' adjacent to each other in the second direction, or the basic circuits or macro-cells 40' adjacent to each other in the second direction are interconnected by the first-layer signal wiring 19'. The basic circuits or macro-cells 40' adjacent to each other in the second direction, or macro-cells 40' arranged relatively closely to each other in the second direction are interconnected by the third-layer signal wiring 23'.

Figure 22:
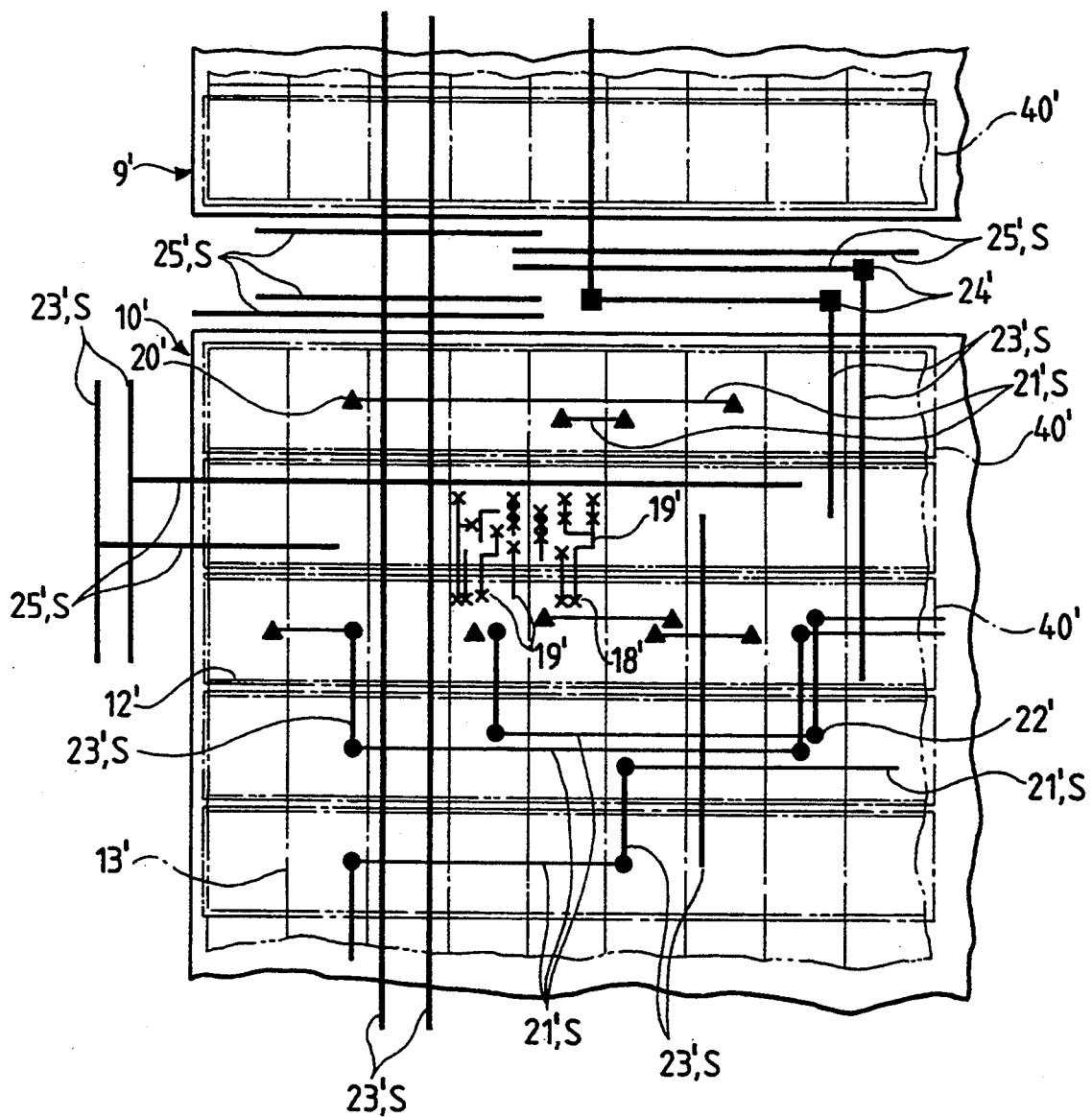
FIG. 22 shows a connection diagram of the macro-cell.

The macro-cells 10' and 9' in FIG. 22 consisting of these basic circuits or macro-cells 40' are directly interconnected by the third-layer signal wiring 23' or by the third-layer signal wiring 23' and fourth-layer signal wiring 25'.

In the semiconductor integrated circuit device 1' thus configured by using the standard cell system, the macro-cells 7', 8', and 10' performing high-speed operations are basically so designed that all wiring layers of the four-layer structure are used, the power feed capacity is improved, and the wiring channel areas are eliminated as much as possible, the wiring lengths are shortened as much as possible, and crosstalk noise are minimized as much as possible. Most of the semiconductor integrated circuit devices 1' using the standard cell system are automatically designed by an automatic routing system (DA). However, the macro-cells 7', 8', and 10' performing high-speed operations are manually or semi-manually designed. In other macro-cells 4', 5', 6', and 11', the first-layer wirings 19' and second-layer wirings 21' of the four-layer wiring structure are mainly interconnected and automatically designed by the support of the DA.

Thus, the semiconductor integrated circuit device 1' of this embodiment using the standard cell system has the advantage based on the following configuration.

(1) in the semiconductor integrated circuit device 1' using the standard cell system in which a plurality of basic cells 12' (or 13') including a plurality of MISFETs Q whose gate length is aligned in the first direction are regularly arranged in the first direction and the second direction intersecting with the first direction and the MISFETs Q in each basic cell 12' and some of the above basic cells 12' are interconnected to constitute the macro-cell 10' (or 7' and 8', or 40'), the MISFETs Q in each basic cell 12' in the macro-cell 10' are interconnected by the first-layer signal wirings 19' arranged over the gate electrodes 15' of the MISFETs Q in the basic cell 12', the basic cells 12' adjacent to each other in the second direction in the macro-cell 10' are interconnected by the first-layer signal wiring 19' extending in the second direction among the second-layer signal wirings 19', the basic cells 12' adjacent to each other in the first direction in the macro-cell 10' are interconnected by the second-layer signal wiring 21' arranged over the first-layer signal wiring 19' and extending in the first direction, and the MISFETs Q in each basic cell 12' adjacent to each other in the first direction receive power from the second-layer power supply wiring 21' located in the same layer of the second-layer signal wiring 21' and extending in the same first direction. By this configuration, the first-layer signal wiring 19' in the same layer of the first-layer signal wiring 19' (wiring in basic cell, 19' for interconnecting the MISFETs Q in each basic cell 12' in the macro-cell 10' is extended in the second direction (by using the wiring in basic cell for the wiring for interconnecting basic cells), and wiring channel areas for forming the signal wirings other than the first-layer signal wiring 19' and for connecting the first-layer signal wiring 19' to the other signal wirings are not interposed between basic cells 12' adjacent to each other in the second direction. Therefore, it is possible to decrease the area occupied by the macro-cells 10' and improve the integration degree of the semiconductor integrated circuit device 1' using the standard cell system. Moreover, the basic circuits can be arranged successively in the first direction by extending the second-layer signal wiring 21' and second-layer power supply wiring 21' in the first direction, and the probability of occurrence of unused (useless) basic cells (or MISFETs in the basic cells) 12' not used as basic circuits and arranged in the first direction can be lowered. Therefore, it is possible to decrease the area occupied by the macro-cells 10' and improve the integration degree of the semiconductor integrated circuit device 1' using the standard cell system by effectively using the basic cells 12'. Furthermore, because the length of the first-layer signal wiring 19' extending in the second direction in the macro-cell 10' can be decreased and that of the second-layer signal wiring 21' extending in the first direction in tie macro-cell 10' can be decreased. Therefore, it is possible to increase the operation speeds of the macro-cells 10' and resultingly increase the operation speed of the semiconductor integrated circuit device 1' using the standard cell system.

(2) The second-layer power supply wiring 21' has a wiring width approximately equal to the gate width of the MISFETs Q in the basic cell 12' and extends in the first direction over the MISFET. By this configuration, the second-layer power wiring 21' is formed in an independent wiring layer separate from the first-layer signal wiring 19' for interconnecting the MISFETs Q in the basic cell 12' and the width of the second-layer power wiring 21' can be increased up to a value close to the gate width of each MISFET Q (accurately, up to an allowable distance between terminals at one end and the other of the gate electrode 15' of each MISFET Q). Therefore, it is possible to decrease the resistance of the secondlayer power wiring 21' improve the power supply noise absorbing capacity (resultingly, decreasing the waiting time of circuit operation), and increase the operation speed of the semiconductor integrated circuit device 1' using the standard cell system.

(3) The source or drain region (p-type semiconductor region 17' or n-type semiconductor region 16') of each MISFET Q in the basic cell 12' is shunted by the first-layer shunting wiring 19' in the same wiring layer of the first-layer signal wiring 19' for interconnecting the MISFETs Q in the basic cell 12'. This configuration makes it possible to decrease the resistance of the source or drain region of each MISFET Q in the basic cell 12' and increase the power feed speed or signal transmission speed. Therefore, it is possible to increase the operation speeds of the macro-cells 10' and that of the semiconductor integrated circuit device 1' using the standard cell system.

(4) The first-layer signal wiring 19' is composed of a refractory metal film and the second-layer signal wiring 21' and second-layer power supply wiring 21' are composed of a single layer of either of aluminum and aluminum-alloy films or a multilayered film made by forming any one of the refractory metal film, refractory metal alloy film, and refractory metal nitride film on an aluminum or aluminum-alloy film. This configuration makes it possible to decrease mutual diffusion between Si of the drain or source regions of the MISFETs Q in the basic cell 12' and Al of the second-layer signal wiring 21' or second-layer power wiring 21' by means of the first-layer signal wiring 19' or first-layer shunting wiring 19' serving as an intermediate layer, and also decrease the connection resistance between the drain or source region and the second-layer signal wiring 21' or second-layer power supply wiring 21'. Therefore, it is possible to increase the operation speeds of the macro-cells 10' and resultingly increase the operation speed of the semiconductor integrated circuit device 1' using the standard cell system.

(5) Above the basic cells 12' in the macro-cell 10', the third-layer signal wiring 23' is provided over the second-layer signal wiring 21' and extends in the second direction, and the fourth-layer signal wiring 25' and fourth-layer power supply wiring 25' are arranged over the third-layer signal wiring 23' and extend in the first direction are present. By this configuration, the third-layer signal wiring 23' and fourth-layer signal wiring 25' for interconnecting the basic cells 12', basic circuits, or macro-cells 40' are arranged in an empty area (apparently within the area occupied by basic cells) over the basic cell 12', and the wiring channel area for arranging the third-layer signal wiring 23' and fourth-layer signal wiring 25' between basic cells 12' is omitted. Therefore, it is possible to decrease the area occupied by the macro-cells 40' or occupied area between macro-cells 4') or the area occupied by the macro-cells 10' by the amount equivalent to the wiring channel area and improve the integration degree of the semiconductor integrated circuit device 1' using the standard cell system. As a result, the intervals between the basic cells 12' in the macro-cells 10' and those between the macro-cells 40' can be decreased and the lengths of the third-layer signal wiring 23' and fourth-layer signal wiring 25' can be decreased. Therefore, it is possible to increase the signal transmission speed and also increase the operation speed of the semiconductor integrated circuit device 1' using the standard cell system. (6) The fourth-layer power supply wiring 25' is formed over the second-layer signal wiring 21' and the fourth-layer signal wiring 25' is formed over the second-layer power supply wiring 21'. By this configuration, the distance between the second-layer signal wiring 21' and fourth-layer signal wiring 25' can be increased compared with the case in which the fourth-layer signal wiring 25' is formed over the second-layer signal wiring 21' and the crosstalk noises (coupling noises) between the second-layer signal wiring 21' and fourth-layer signal wiring 25' can be decreased. Therefore, it is possible to improve the reliability of circuit operation of the semiconductor integrated circuit device 1' using the standard cell system.

Though the embodiments of the present invention made by the inventor have been concretely described, it is not restricted to the embodiments but various modifications are allowed as long as they do not deviate from the gist of the invention.

The present invention can be applied to not only the semiconductor integrated circuit devices using the standard cell system but semiconductor integrated circuit devices using any one of the custom, gate array, and master-slice systems, in other words, any type of AS-ICs.

The following are advantages obtained from typical inventions among those disclosed through this application.

(A) The circuit operation speed of ASICs can be increased.

(B) The integration degree of ASICs can be raised.

(C) The circuit operation reliability of ASICs can be improved.

What is claimed is:

1. A semiconductor integrated circuit device, adopting a gate array scheme, comprising:
a semiconductor substrate;
a plurality of basic cells formed on a main surface of said semiconductor substrate and arranged in a first direction and in a second direction, perpendicular to said first direction,
wherein each of said plurality of basic cells includes p-channel MISFETs and n-channel MISFETs, said p-channel MISFETs being arranged in said first direction, said n-channel MISFETs being arranged in said first direction, and said n-channel MISFETs being arranged adjacent to said p-channel MISFETs in said second direction,
wherein the p-channel and n-channel MISFETs have gate electrodes each disposed in such a manner that a gate length thereof is measured along said first direction and a gate width thereof is measured along said second direction, and
wherein the p-channel and n-channel MISFETs have semiconductor regions, serving as source and drain regions thereof, formed in said semiconductor substrate;
a first insulating film formed over said basic cells and said semiconductor substrate;

a first wiring layer, made of a metal film and formed on said first insulating film, including first, second and third wirings, wherein said first wirings are formed over said semiconductor regions of the p-channel and n-channel MISFETs so as to cover substantially the entirety of a plan view area of said semiconductor regions and are for electrical connection to said semiconductor regions, wherein said second wirings are extended over said semiconductor regions of the p-channel and n-channel MISFETS so as to cover substantially the entire plan view area of said semiconductor regions and are provided for electrical connection to said semiconductor regions, each said second wiring extending, within said basic cell, between a respective p-channel MISFET and a respective n-channel MISFET so as to electrically connect the semiconductor region of said p-channel MISFET to the semiconductor region of said n-channel MISFET, and wherein said third wirings are electrically connected to said gate electrodes of respective ones of the p-channel and n-channel MISFETs of a basic cell in such a manner that for each such connection a respective wiring is extended from said basic cell to an adjacent basic cell in said second direction;

a second insulating film formed over said first insulating film and said first wiring layer;

a second wiring layer, made of a metal film and formed on said second insulating film, including first and second supply wirings and first and second signal lines each extending in said first direction;

wherein said first and second supply wirings are extended, within said basic cell, over said first and second wirings so as to cover at least part of said semiconductor regions and are for electrical connection to said first wirings, said first supply wiring supplying a source voltage to said p-channel MISFETs, and said second supply wiring supplying a grounding voltage to said n-channel MISFETs, wherein said first signal lines are extended over said second wirings and are arranged between said first and second supply wirings, said first signal lines being provided for electrical connection to said second wirings, and wherein said second signal lines are formed over said third wirings and are electrically connected to said third wirings;

a third insulating film formed over said second insulating film and said second wiring layer;

a third wiring layer, formed of a metal film and formed on said second insulating film, including third signal lines extending in said second direction, wherein said third signal lines are extended over said plurality of basic cells and are for electrical connection to said first and second signal lines, and wherein said first, second and third signal lines are used for providing electrical connections between different ones of said plurality of basic cells.

2. A semiconductor integrated circuit device according to claim 1, further comprising fourth wirings formed of said first wiring layer, wherein each fourth wiring is extended in said second direction, within said basic cell, between a respective p-channel MISFET and a respective n-channel MISFET so as to electrically connect the gate electrode of said p-channel MISFET to the gate electrode of said n-channel MISFET, and wherein said fourth wirings are to be electrically connected to said first signal lines.

3. A semiconductor integrated circuit device according to claim 2, further comprising fifth wirings formed of said first wiring layer, wherein said fifth wirings are extended over said semiconductor regions of the p-channel and n-channel MISFETs so as to cover substantially the entire plan view area of said semiconductor regions and are provided for electrical connection to said semiconductor regions, each said fifth wiring being extended, within said basic cell, between said p-channel MISFET and said n-channel MISFET so as to electrically connect said semiconductor region of said p-channel MISFET to said semiconductor region of said n-channel MISFET, and wherein said fifth wirings are extended in said second direction in such a manner that each fifth wiring is extended from said basic cell to an adjacent basic cell in said second direction, and wherein said fifth wirings are to be electrically connected to said second signal lines.

4. A semiconductor integrated circuit device according to claim 3, wherein said first wiring layer is formed of a high melting metal, said second wiring layer is formed of a metal film containing aluminum, and said third wiring layer is formed of a metal film containing aluminum.

5. A semiconductor integrated circuit device according to claim 4, further comprising a field insulating film formed on said semiconductor substrate, wherein said basic cells are separated by said field insulating film, wherein said p-channel MISFETs and said n-channel MISFETs are separated, within said basic cell, by said field insulating film, and wherein said first insulating film is formed over said field insulating film.

6. A semiconductor integrated circuit device according to claim 2, wherein said first wiring layer is formed of a high melting metal, said second wiring layer is formed of a metal film containing aluminum, and said third wiring layer is formed of a metal film containing aluminum.

7. A semiconductor integrated circuit device according to claim 6, further comprising a field insulating film formed on said semiconductor substrate, wherein said basic cells are separated by said field insulating film, wherein said p-channel MISFETs and said n-channel MISFETs are separated, within said basic cell, by said field insulating film, and wherein said first insulating film is formed over said field insulating film.

8. A semiconductor integrated circuit device according to claim 1, further comprising:

a fourth insulating film formed over said third wiring layer and said third insulating film; and a fourth wiring layer formed of a metal film containing aluminum and being formed on said fourth insulating film, said fourth wiring layer including third and fourth supply wirings and fourth signal lines each extending in said first direction, wherein said fourth signal lines are extended over said first and second supply wirings and are for electrical connection to said third signal lines, and wherein said third and fourth supply wirings are extended over said second signal lines and are for electrical connection to said first and second supply wirings, respectively.

9. A semiconductor integrated circuit device, adopting a gate array scheme, comprising:

a semiconductor substrate;

a plurality of basic cells formed on a main surface of said semiconductor substrate and arranged in a first direction and in a second direction, perpendicular to said first direction, wherein each of said plurality of basic cells includes p-channel MISFETs and n-channel MISFETs, said p-channel MISFETs being arranged in said first direction, said n-channel MISFETs being arranged in said first direction, and said n-channel MISFETs being arranged adjacent to said p-channel MISFETs in said second direction, wherein the p-channel and n-channel MISFETs have gate electrodes each disposed in such a manner that a gate length thereof is measured along said first direction and a gate width thereof is measured along said second direction, and wherein the p-channel and n-channel MISFETs have semiconductor regions, serving as source and drain regions, formed in said semiconductor substrate;

a first insulating film formed over said basic cells and said semiconductor substrate;

a first wiring layer, made of a metal film and formed on said first insulating film, including first, second and third wirings, wherein said first wirings are formed over said semiconductor regions of the p-channel and n-channel MISFETs so as to cover substantially the entirety of a plan view area of said semiconductor regions and are for electrical connection to said semiconductor regions, wherein said second wirings are extended over said semiconductor regions of the p-channel and n-channel MISFETS so as to cover substantially the entire plan view area of said semiconductor regions and are provided for electrical connection to said semiconductor regions, each said second wiring extending, within said basic cell, between a respective p-channel MISFET and a respective n-channel MISFET so as to electrically connect said semiconductor region of said p-channel MISFET to said semiconductor region of said n-channel MISFET, and wherein said third wirings are electrically connected to said gate electrodes of respective ones of the p-channel and n-channel MISFETs of a basic cell in such a manner that for each such connection a respective third wiring is extended from said basic cell to an adjacent basic cell in said second direction;

a second insulating film formed over said first insulating film and said first wiring layer;

a second wiring layer, formed of an aluminum film and formed on said second insulating film, including first and second signal lines each extending in said first direction, and further including first wiring means for supplying a source voltage to said p-channel MISFETs and second wiring means for supplying a grounding voltage to said n-channel MISFETs, wherein said first and second wiring means are extended in said first direction over said first and second wirings so as to cover at least part of said semiconductor regions and are for electrical connection to said first wirings, wherein said first signal lines are extended over said second wirings and are arranged between said first wiring means and second wiring means, said first signal lines being provided for electrical connection to said second wirings, and wherein said second signal lines are formed over said third wirings and are for electrical connection to said third wirings;

a third insulating film formed over said second insulating film and said second wiring layer;

a third wiring layer, formed of an aluminum film and being formed on said second insulating film, including third signal lines extending in said second direction, wherein said third signal lines are extended over said basic cells and are for electrical connection to said first and second signal lines, and wherein said first, second and third signal lines are used for providing electrical connections between different ones of said plurality of basic cells.

10. A semiconductor integrated circuit device according to claim 9, further comprising fourth wirings formed of said first wiring layer, wherein each fourth wiring is extended in said second direction, within said basic cell, between a respective p-channel MISFET and a respective n-channel MISFET so as to electrically connect the gate electrode of said p-channel MISFET to the gate electrode of said n-channel MISFET, and wherein said fourth wirings are to be electrically connected to said first signal lines.

11. A semiconductor integrated circuit device according to claim 10, further comprising fifth wirings formed of said first wiring layer, wherein said fifth wirings are extended over said semiconductor regions of the p-channel and n-channel MISFETs so as to cover substantially the entire plan view area of said semiconductor regions and are provided for electrical connection to said semiconductor regions, each said fifth wiring being extended, within said basic cell, between said p-channel MISFET and said n-channel MISFET so as to electrically connect the semiconductor region of said p-channel MISFET to the semiconductor region of said n-channel MISFET, wherein said fifth wirings are extended in said second direction in such a manner that each fifth wiring is extended from said basic cell to an adjacent basic cell in said second direction, and wherein said fifth wirings are to be electrically connected to said second signal lines.

12. A semiconductor integrated circuit device according to claim 10, further comprising a field insulating film formed on said semiconductor substrate, wherein said basic cells are separated by said field insulating film, wherein said p-channel MISFETs and said n-channel MISFETs are separated, within said basic cell, by said field insulating film, and wherein said first insulating film is formed over said field insulating film.

13. A semiconductor integrated circuit device according to claim 12, further comprising:

a fourth insulating film formed over said third wiring layer and said third insulating film; and a fourth wiring layer formed of a metal film containing aluminum and being formed on said fourth insulating film, said fourth wiring layer including third and fourth wiring means and fourth signal lines each extending in said first direction, wherein said fourth signal lines are extended over said first and second wiring means and are for electrical connection to said third signal lines, and wherein said third and fourth wiring means are extended over said second signal lines and are for electrical connection to said first and second wiring means, respectively.

* * * * *